US008133774B2

(12) United States Patent
Botula et al.

(10) Patent No.: US 8,133,774 B2
(45) Date of Patent: Mar. 13, 2012

(54) SOI RADIO FREQUENCY SWITCH WITH ENHANCED ELECTRICAL ISOLATION

(75) Inventors: Alan B. Botula, Essex Junction, VT (US); Alvin J. Joseph, Williston, VT (US); Edward J. Nowak, Essex Junction, VT (US); Yun Shi, South Burlington, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 12/411,494

(22) Filed: Mar. 26, 2009

(65) Prior Publication Data

US 2010/0244934 A1    Sep. 30, 2010

(51) Int. Cl.
*H01L 21/00* (2006.01)
(52) U.S. Cl. ............................ 438/164; 257/E27.112
(58) Field of Classification Search .................. 257/347, 257/E21.334, E29.273, E27.112; 438/533, 438/637, 155, 164; 327/534; 716/136
See application file for complete search history.

(56) References Cited

U.S. PATENT DOCUMENTS

| | | | |
|---|---|---|---|
| 6,071,803 A | 6/2000 | Rutten | |
| 6,956,289 B2 | 10/2005 | Kunikiyo | |
| 7,091,604 B2 | 8/2006 | Wylie et al. | |
| 7,297,995 B2 | 11/2007 | Mouli | |
| 7,304,354 B2 | 12/2007 | Morris | |
| 2002/0043686 A1 | 4/2002 | Bolam et al. | |
| 2003/0201488 A1 | 10/2003 | Nii | |
| 2003/0203546 A1* | 10/2003 | Burbach et al. | 438/151 |
| 2004/0241917 A1* | 12/2004 | Schwan et al. | 438/151 |
| 2005/0212071 A1* | 9/2005 | Yue et al. | 257/452 |
| 2006/0038252 A1 | 2/2006 | Mouli | |
| 2006/0163688 A1 | 7/2006 | Ding et al. | |
| 2007/0158678 A1 | 7/2007 | Udrea | |
| 2008/0124889 A1 | 5/2008 | Roggenbauer et al. | |
| 2008/0171419 A1 | 7/2008 | Wen et al. | |

FOREIGN PATENT DOCUMENTS

| | | |
|---|---|---|
| EP | 0 676 815 A1 | 10/1995 |
| WO | 2005098937 A1 | 10/2005 |
| WO | 2008112081 A1 | 9/2008 |

OTHER PUBLICATIONS

International Search Report dated Jul. 22, 2010.

* cited by examiner

*Primary Examiner* — Evan Pert
*Assistant Examiner* — Selim Ahmed
(74) *Attorney, Agent, or Firm* — Scully, Scott, Murphy & Presser, P.C.; Richard M. Kotulak, Esq.

(57) ABSTRACT

At least one conductive via structure is formed from an interconnect-level metal line through a middle-of-line (MOL) dielectric layer, a shallow trench isolation structure in a top semiconductor layer, and a buried insulator layer to a bottom semiconductor layer. The shallow trench isolation structure laterally abuts at least two field effect transistors that function as a radio frequency (RF) switch. The at least one conductive via structure and the at interconnect-level metal line may provide a low resistance electrical path from the induced charge layer in a bottom semiconductor layer to electrical ground, discharging the electrical charge in the induced charge layer. The discharge of the charge in the induced charge layer thus reduces capacitive coupling between the semiconductor devices and the bottom semiconductor layer, and thus secondary coupling between components electrically disconnected by the RF switch is reduced.

25 Claims, 19 Drawing Sheets

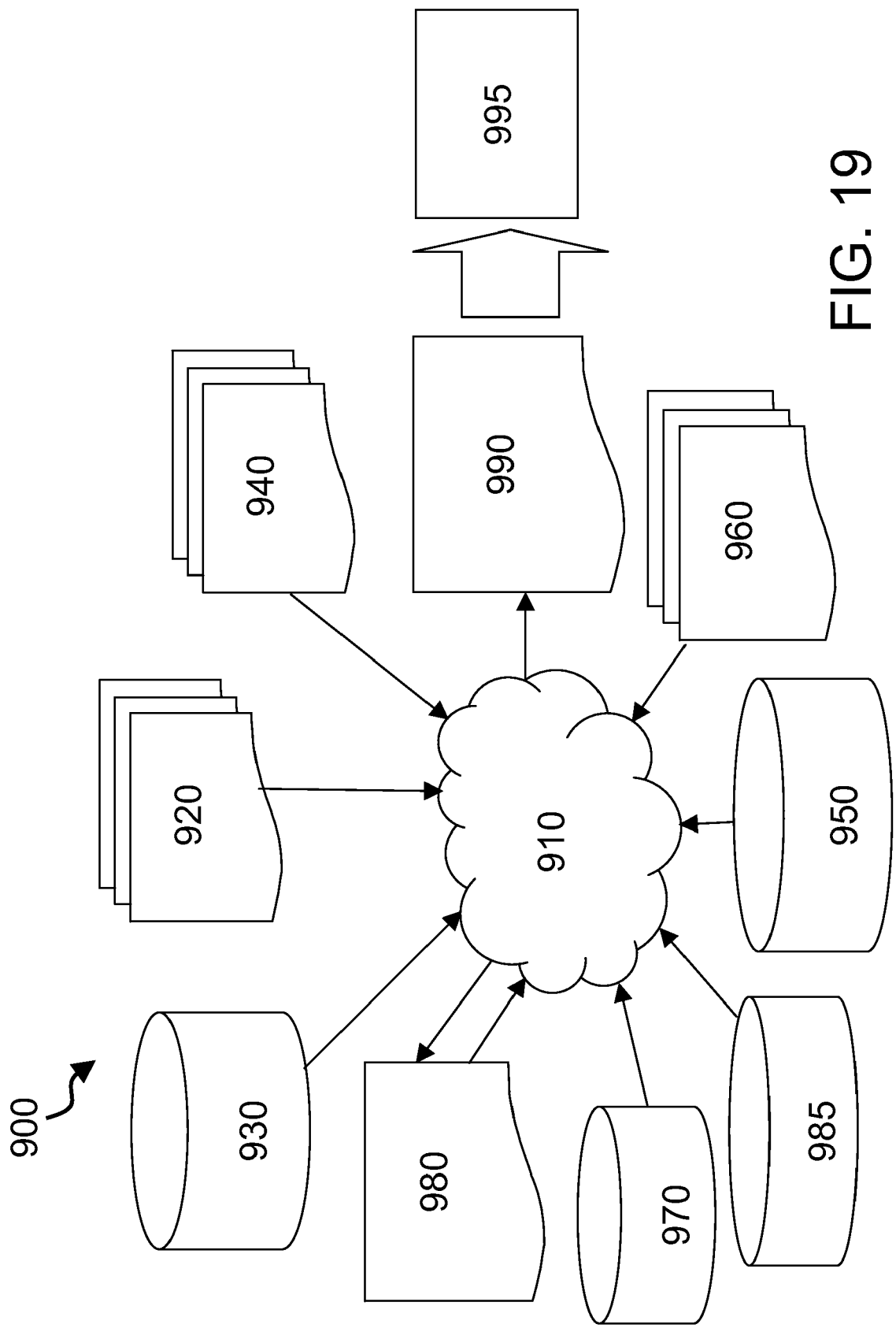

SOI RADIO FREQUENCY SWITCH WITH ENHANCED ELECTRICAL ISOLATION

BACKGROUND

The present invention relates to semiconductor structures, and particularly to a semiconductor structure including a radio frequency switch on a semiconductor-on-insulator (SOI) substrate, and design structure and methods of manufacturing the same.

Semiconductor devices such as field effect transistors are employed as a switching device for radio frequency (RF) signals in analog and RF applications. Semiconductor-on-insulator (SOI) substrates are typically employed for such applications since parasitic coupling between devices through the substrate is reduced due to the low dielectric constant of a buried insulator layer. For example, the dielectric constant of silicon, which comprises the entirety of the substrate of a bulk silicon substrate, is about 11.9 in gigahertz ranges. In contrast, the dielectric constant of silicon oxide, which isolates a top semiconductor layer containing devices from a handle substrate, is about 3.9. By providing the buried insulator layer, which has a dielectric constant less than the dielectric constant of a semiconductor material in a bulk substrate, the SOI substrate reduces capacitive coupling between an individual semiconductor device and the substrate, and consequently, reduces secondary capacitive coupling between semiconductor devices through the substrate.

However, even with the use of an SOI substrate, the secondary capacitive coupling of electrical signals between semiconductor devices is significant due to the high frequency range employed in the radio frequency applications, which may be, for example, from about 900 MHz to about 1.8 GHz, and may include even higher frequency ranges. This is because the capacitive coupling between electrical components increases linearly with frequency.

For a radio frequency (RF) switch formed on an SOI substrate, the semiconductor devices comprising the RF switch and the signal processing units in a top semiconductor layer are capacitively coupled through a buried insulator layer to a bottom semiconductor layer. Even if the semiconductor devices in the top semiconductor layer employ a power supply voltage from about 3 V to about 9V, the transient signals and signal reflections in an antenna circuitry may increase the actual voltage in the top semiconductor layer up to about 30V. Such voltage conditions induce a significant capacitive coupling between the semiconductor devices subjected to such high voltage signals and an induced charge layer within an upper portion of the bottom semiconductor layer, which changes in thickness and charge polarity at the frequency of the RF signal in the semiconductor devices in the top semiconductor layer. The induced charge layer capacitively couples with other semiconductor devices in the top semiconductor layer including the semiconductor devices that an RF switch is supposed to isolate electrically. The spurious capacitive coupling between the induced charge layer in the bottom semiconductor layer and the other semiconductor devices provides a secondary capacitive coupling, which is a parasitic coupling that reduces the effectiveness of the RF switch. In this case, the RF signal is applied to the other semiconductor devices through the secondary capacitive coupling although the RF switch is turned off.

Referring to FIG. 1, a prior art radio frequency switch comprises a set of serially connected field effect transistors formed on a semiconductor-on-insulator (SOI) substrate 8. The SOI substrate 8 comprises a bottom semiconductor layer 10, a buried insulator layer 20, and a top semiconductor layer 30. The top semiconductor layer 30 includes top semiconductor portions 32 and shallow trench isolation structures 33 which provide electrical isolation between adjacent top semiconductor portions 32. Each field effect transistor comprises a gate electrode 42, a gate dielectric 40, a gate spacer 44, and source and drain regions (not shown) formed in a top semiconductor portion 32. The field effect transistors are serially connected via a set of contact vias 88 and interconnect-level metal lines 98. The contact vias 88 are embedded in a middle-of-line (MOL) dielectric layer 80, and the interconnect-level metal lines 98 are formed in an interconnect-level dielectric layer 90.

A high voltage signal, which may have a voltage swing up to about ±30V induces an induced charge layer 11 in an upper portion of the bottom semiconductor layer 10 through a capacitive coupling, which is schematically indicated by a set of capacitors 22 between the semiconductor devices and the bottom semiconductor layer 10. The induced charge layer 11 contains positive charges while the voltage in the semiconductor devices in the top semiconductor layer 30 have a negative voltage, and negative charges while the voltage in the semiconductor devices in the top semiconductor layer 30 have a positive voltage. The high frequency of the RF signal in the semiconductor devices induces changes in the thickness of the induced charge layer 11 and the polarity of the charges in the induced charge layer at the same frequency as the frequency of the RF signal.

The time required to dissipate the charges in the induced charge layer 11 is characterized by an RC time constant, which is determined by the capacitance of the set of capacitors 22 and a substrate resistance. The substrate resistance is the resistance between the induced charge layer 11 and electrical ground, which is typically provided by an edge seal at the boundary of a semiconductor chip. The substrate resistance is symbolically represented by a resistor 12 between the induced charge layer 11 and electrical ground. Such substrate resistance may be extremely high because the bottom semiconductor layer 10 typically employs a high resistivity semiconductor material having a resistivity of about 5 Ohms-cm to minimize eddy current. Further, the lateral distance to an edge seam may be up to about half the lateral dimension of the semiconductor chip, e.g., on the order of about 1 cm.

Such large substrate resistance 12 increases the RC time constant for the dissipation of the charge in the induced charge layer 11 beyond the time scale of the period of the RF signal. Since dissipation of the charge in the induced charge layer 11 is effectively barred due to a long RC time constant, the capacitive coupling between the semiconductor devices in the top semiconductor layer 30 and the bottom semiconductor layer 10 results in loss of signal even during the off-state of the RF switch. Further, spurious RF signal is introduced into semiconductor devices that are disconnected by the RF switch from the RF signal through the secondary capacitive coupling of the semiconductor devices through the induced charge layer 11.

SUMMARY

The present invention provides a semiconductor structure including at least one contact via structure providing electrical contact to a bottom semiconductor layer through a buried insulator layer and a top semiconductor layer, and methods of manufacturing the same.

In the present invention, at least one conductive via structure is formed from an interconnect-level metal line through a middle-of-line (MOL) dielectric layer, a shallow trench isolation structure in a top semiconductor layer, and a buried insulator layer to a bottom semiconductor layer, which includes an induced charge layer at an interface with the buried insulator layer. The shallow trench isolation structure laterally abuts at least two field effect transistors that function as a radio frequency (RF) switch. The at least one conductive via structure and the at interconnect-level metal line may provide a low resistance electrical path from the induced charge layer to a constant voltage source or electrical ground, thereby rapidly discharging the electrical charge in the induced charge layer within the time scale of the period of the RF frequency. The discharge of the charge in the induced charge layer thus reduces capacitive coupling between the semiconductor devices and the bottom semiconductor layer, and thus secondary coupling between components electrically disconnected by the RF switch is reduced.

According to an aspect of the present invention, a semiconductor structure is provided, which comprises:

at least two field effect transistors located on a top semiconductor layer of a semiconductor-on-insulator (SOI) substrate;

a shallow trench isolation structure laterally abutting the at least two field effect transistors; and at least one conductive via extending from a top surface of a middle-of-line (MOL) dielectric layer through the MOL dielectric layer, the shallow trench isolation structure, a buried insulator layer, and to a top surface of a bottom semiconductor layer of the SOI substrate, wherein the at least one conductive via is interposed between the at least two field effect transistors and separates the at least two field effect transistors.

In one embodiment, each of the at least one conductive via is of unitary construction and extends from the top surface of the MOL dielectric layer to the top surface of the bottom semiconductor layer.

In another embodiment, each of the at least one conductive via comprises a vertically abutting stack of a lower contact via and an upper contact via, wherein a top surface of the upper conductive via extends to the top surface of the MOL dielectric layer, and a bottom surface of the lower conductive via extends to the top surface of the bottom semiconductor layer.

In even another embodiment, the at least one conductive via comprises an array of conductive vias that do not abut one another.

In yet another embodiment, the semiconductor structure further comprises an induced charge layer located in an upper portion of the bottom semiconductor layer and including positive charges or negative charges.

In still another embodiment, the at least one of the at least two field effect transistors constitutes a radio frequency switch for a signal having a frequency from about 3 Hz to about 300 GHz.

In a further embodiment, the at least one conductive via comprises a contact via of unitary construction and laterally surrounding an entirety of the at least two field effect transistors.

In a yet further embodiment, the semiconductor structure further comprises an array of conductive vias vertically abutting the contact via of unitary construction, wherein the array of conductive vias is embedded in the MOL dielectric layer, and the contact via vertically extends from a top surface of the top semiconductor layer to the top surface of the bottom semiconductor layer.

In a still further embodiment, the semiconductor structure further comprises an array of conductive vias vertically abutting the contact via of unitary construction, wherein the conductive via of unitary construction is embedded in the MOL dielectric layer, and each conductive via in the array of contact vias vertically extends from a top surface of the top semiconductor layer to the top surface of the bottom semiconductor layer.

According to another aspect of the present invention, a design structure embodied in a machine readable medium for designing, manufacturing, or testing a design for a semiconductor structure is provided. The design structure comprises:

a first data representing at least two field effect transistors located on a top semiconductor layer of a semiconductor-on-insulator (SOI) substrate;

a second data representing a shallow trench isolation structure laterally abutting the at least two field effect transistors; and a third data representing at least one conductive via extending from a top surface of a middle-of-line (MOL) dielectric layer through the MOL dielectric layer, the shallow trench isolation structure, a buried insulator layer, and to a top surface of a bottom semiconductor layer of the SOI substrate, wherein the at least one conductive via is interposed between the at least two field effect transistors and separates the at least two field effect transistors.

In one embodiment, the third data represents at least one conductive via of unitary construction extending from the top surface of the MOL dielectric layer to the top surface of the bottom semiconductor layer.

In another embodiment, the third data represents at least one conductive via, each of which comprises a vertically abutting stack of a lower contact via and an upper contact via, wherein a top surface of the upper conductive via extends to the top surface of the MOL dielectric layer, and a bottom surface of the lower conductive via extends to the top surface of the bottom semiconductor layer.

In even another embodiment, the third data represents an array of conductive vias that do not abut one another.

In yet another embodiment, the third data represents a contact via of unitary construction and laterally surrounding an entirety of the at least two field effect transistors.

In still another embodiment, the first data represents a radio frequency switch for a signal having a frequency from about 3 Hz to about 300 GHz.

According to another an aspect of the present invention, a method of forming a semiconductor structure is provided, which comprises:

forming at least two field effect transistors on a top semiconductor layer of a semiconductor-on-insulator (SOI) substrate;

forming a shallow trench isolation structure in the top semiconductor layer, wherein the shallow trench isolation structure laterally abuts and surrounds the at least two field effect transistors;

forming a middle-of-line (MOL) dielectric layer over the at least two field effect transistors and the shallow trench isolation structure; and forming at least one conductive via extending from a top surface of the MOL dielectric layer through the MOL dielectric layer, the shallow trench isolation structure, a buried insulator layer, and to a top surface of a bottom semiconductor layer of the SOI substrate, wherein the at least one conductive via is interposed between the at least two field effect transistors and separates the at least two field effect transistors.

In one embodiment, the method further comprises:

forming at least one via cavity extending from the top surface of the MOL dielectric layer to the top surface of the bottom semiconductor layer; and filling the at least one via cavity with a conductive material, wherein the at least one conductive via is formed by the conductive material that fills the at least one via cavity.

In another embodiment, the method further comprises:

forming at least one via cavity extending from a top surface of the shallow trench isolation structure to the top surface of the bottom semiconductor layer; and filling the at least one via cavity with a conductive material, wherein at least one lower conductive via is formed by the conductive material that fills the at least one via cavity, wherein the at least one conductive via is interposed between the at least two field effect transistors and separates the at least two field effect transistors.

In even another embodiment, the method further comprises:

forming at least another via cavity extending from the top surface of the MOL dielectric layer to at least one top surface of the at least one lower conductive via; and filling the at least another via cavity with another conductive material, wherein at least one upper conductive via is formed by the other conductive material that fills the at least another via cavity.

In yet another embodiment, each of the at least one conductive via comprises a vertically abutting stack of a lower contact via and an upper contact via, wherein a top surface of the upper conductive via extends to the top surface of the MOL dielectric layer, and a bottom surface of the lower conductive via extends to the top surface of the bottom semiconductor layer.

In still another embodiment, the at least one conductive via comprises an array of conductive vias that do not abut one another.

In a further embodiment, the at least one conductive via comprises a contact via of unitary construction and laterally surrounding an entirety of the at least two field effect transistors.

In a yet further embodiment, the method further comprises forming an induced charge layer located in an upper portion of the bottom semiconductor layer and including positive charges or negative charges by applying a radio frequency signal having a frequency from about 3 Hz to about 300 GHz to at least one of the at least two field effect transistors.

In a still further embodiment, at least one of the at least two field effect transistors constitutes a radio frequency switch for a signal having a frequency from about 3 Hz to about 300 GHz.

According to another aspect of the present invention, a method of operating a semiconductor device is provided, which comprises:

providing a semiconductor device including:

at least two field effect transistors located on a top semiconductor layer of a semiconductor-on-insulator (SOI) substrate;

a shallow trench isolation structure laterally abutting the at least two field effect transistors; and at least one conductive via extending from a top surface of a middle-of-line (MOL) dielectric layer through the MOL dielectric layer, the shallow trench isolation structure, a buried insulator layer, and to a top surface of a bottom semiconductor layer of the SOI substrate, wherein the at least one conductive via is interposed between the at least two field effect transistors and separates the at least two field effect transistors;

applying a radio frequency (RF) signal to at least one of the at least two field effect transistors, wherein an induced charge layer is formed directly underneath the buried insulator layer; and electrically biasing the bottom semiconductor layer of the SOI substrate and the at least one conductive via at a constant voltage.

In one embodiment, one of the at least two field effect transistors is a radio frequency switch for a signal having a frequency from about 3 Hz to about 300 GHz.

In another embodiment, the induced charge layer changes thickness in time at a signal frequency of the RF signal in at least one of the at least two field effect transistors.

In even another embodiment, charges in the induced charge layer changes polarity in time at a signal frequency of the RF signal in at least one of the at least two field effect transistors.

In yet another embodiment, the constant voltage is a voltage that is equal to, or less than, a first voltage at a maximum positive swing of the RF signal and is equal to, or greater than, a second voltage at a maximum negative swing of the RF signal.

In still another embodiment, the bottom semiconductor layer and the at least one conductive via are electrically grounded.

BRIEF DESCRIPTION OF THE DRAWINGS

FIGS. 2, 3, 4, and 7 are sequential vertical cross-sectional views. FIGS. 5 and 6 are modified top-down views of first and second configurations of the first exemplary semiconductor structure of FIG. 4 in which a middle-of-line (MOL) dielectric layer 80 is omitted for clarity. The plane Z-Z' in FIGS. 5 and 6 corresponds to the plane of the vertical cross-sectional view in FIG. 4. FIGS. 8 and 9 are top-down views of the first and second configurations, respectively, of the first exemplary semiconductor structure in FIG. 7. The plane Z-Z' in FIGS. 8 and 9 corresponds to the plane of the vertical cross-sectional view in FIG. 7.

FIG. 2 corresponds to a step after formation of at least two field effect transistors and a middle-of-line (MOL) dielectric layer 80. FIG. 3 corresponds to a step after formation of at least one via cavity 59. FIGS. 4, 5, and 6 correspond to a step after formation of at least one conductive via 89. FIGS. 7, 8, and 9 correspond to a step after formation of an interconnect-level dielectric layer 90, first interconnect-level metal lines 98, and a second interconnect-level metal line 99 abutting the at least one conductive via 89.

FIGS. 10, 11, 14, 15, and 18 are sequential vertical cross-sectional views. FIGS. 12 and 13 are top-down views of first and second configurations, respectively, of the second exemplary semiconductor structure of FIG. 11. The plane Z-Z' in FIGS. 12 and 13 corresponds to the plane of the vertical cross-sectional view in FIG. 11. FIGS. 16 and 17 are modified top-down views of third and fourth configurations, respectively, of the second exemplary semiconductor structure of FIG. 15 in which a middle-of-line (MOL) dielectric layer 80 is omitted for clarity. The plane Z-Z' in FIGS. 16 and 17 corresponds to the plane of the vertical cross-sectional view in FIG. 14.

FIG. 10 corresponds to a step after formation of at least one lower via cavity 27 through a shallow trench isolation structure 27 and a buried insulator layer 20. FIGS. 11, 12, and 13 correspond to a step after formation of at least one lower conductive via 37. FIG. 14 corresponds to a step after formation of at least two field effect transistors, a middle-of-line (MOL) dielectric layer 80, and at least one upper via cavity 57. FIGS. 15, 16, and 17 correspond to a step after formation of at least one upper conductive via 87. FIG. 18 corresponds to a step after formation of an interconnect-level dielectric layer 90, first interconnect-level metal lines 98, and a second interconnect-level metal line 99 abutting the at least one conductive via 89.

FIG. 19 is a flow diagram of a design process used in semiconductor design and manufacture of the semiconductor structures according to the present invention.

DETAILED DESCRIPTION

Figure 1:
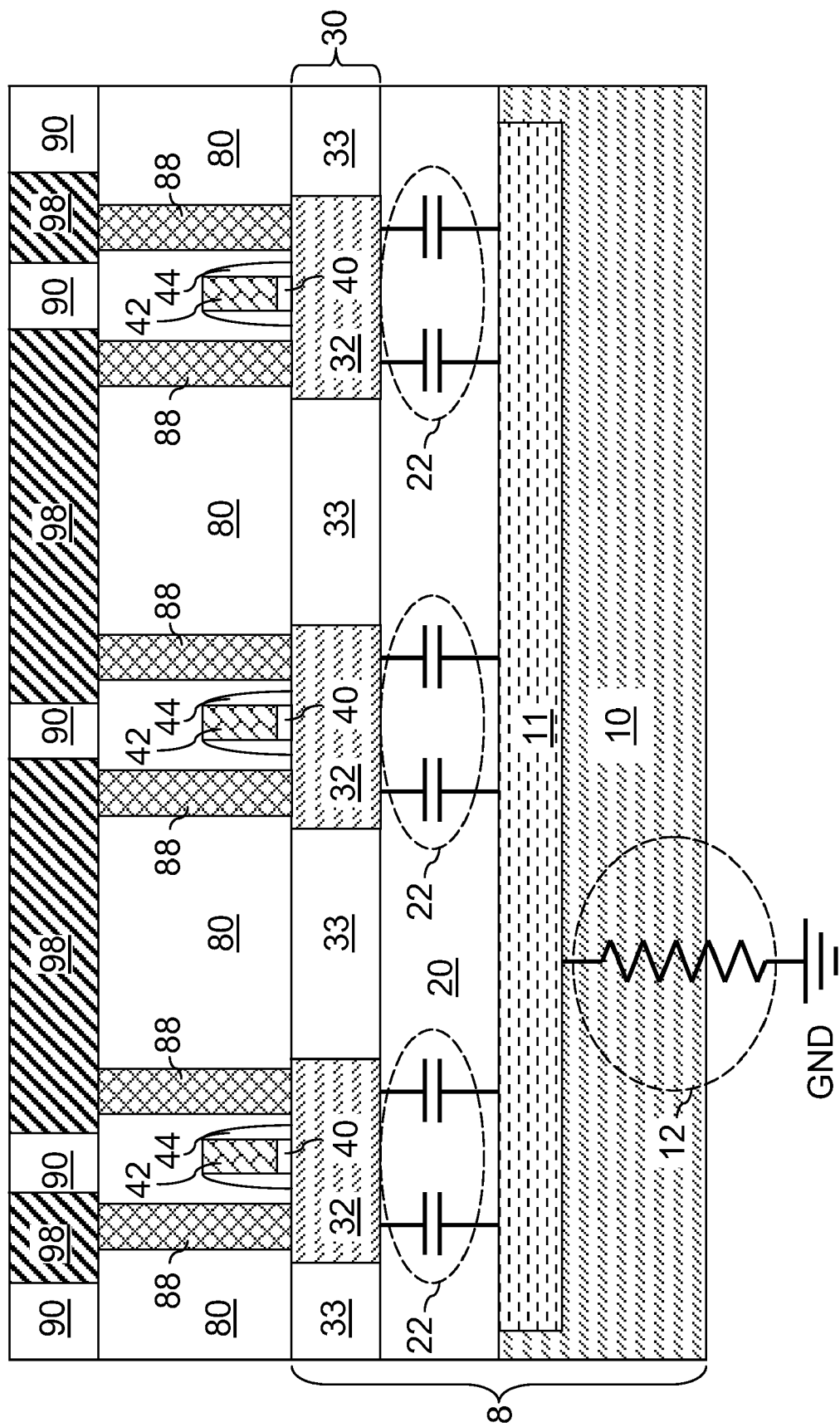
FIG. 1 is a vertical cross-sectional view of a prior art radio frequency switch structure.

As stated above, the present invention relates to a semiconductor structure including a radio frequency switch on a semiconductor-on-insulator (SOI) substrate, and methods of manufacturing the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, radio frequency (RF) denotes a frequency of electromagnetic wave within the range of 3 Hz to 300 GHz. Radio frequency corresponds to the frequency of electromagnetic wave that is used to produce and detect radio waves. Radio frequency includes very high frequency (VHF), ultra high frequency (UHF), super high frequency (SHF), and extremely high frequency (EHF).

As used herein, very high frequency (VHF) refers to a frequency in the range from 30 MHz to 300 MHz. VHF is used, among others, for frequency modulation (FM) broadcasting. Ultra high frequency (UHF) refers to a frequency in the range from 300 MHz to 3 GHz. UHF is used, among others, for mobile telephones, wireless networks, and microwave ovens. Super high frequency (SHF) refers to a frequency in the range from 3 GHz to 30 GHz. SHF is used, among others, for wireless networking, radar, and satellite links. Extremely high frequency (EHF) refers to a frequency in the range from 30 GHz to 300 GHz. EHF produces millimeter waves having a wavelength from 1 mm to 10 mm, and is used, among others, for data links and remote sensing.

Figure 2:
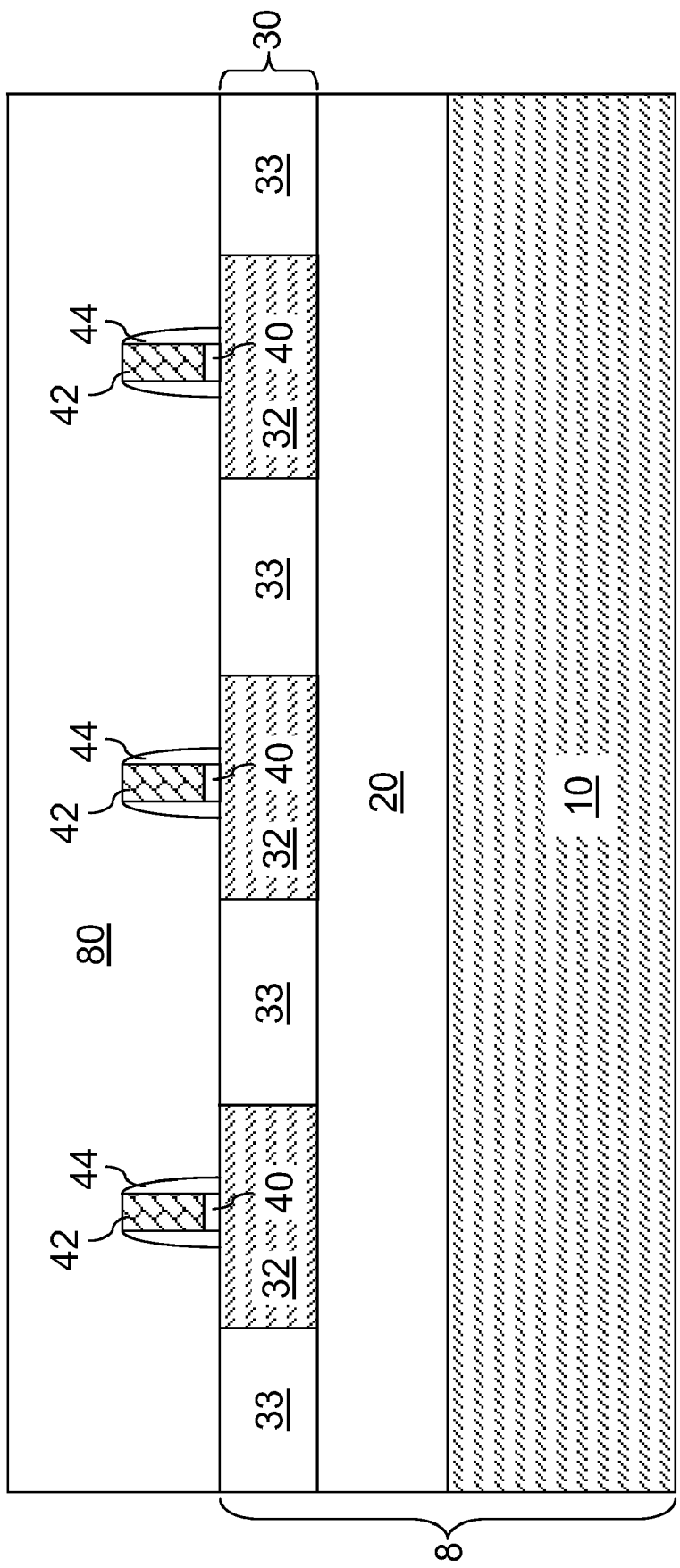
FIGS. 2-9 are various views of a first exemplary semiconductor structure according to a first embodiment of the present invention.

Referring to FIG. 2, a first exemplary semiconductor structure according to a first embodiment of the present invention comprises a semiconductor substrate 8, at least two field effect transistors formed thereupon, and a middle-of-line (MOL) dielectric layer 80. The semiconductor substrate 8 is a semiconductor-on-insulator (SOI) substrate that includes a bottom semiconductor layer 10, a buried insulator layer 20, and a top semiconductor layer 30. The top semiconductor layer 30 includes at least one top semiconductor portion 32 and a shallow trench isolation structure 33.

Each of the bottom semiconductor layer 10 and the at least one top semiconductor portion 32 comprises a semiconductor material such as silicon, a silicon germanium alloy region, silicon, germanium, a silicon-germanium alloy region, a silicon carbon alloy region, a silicon-germanium-carbon alloy region, gallium arsenide, indium arsenide, indium gallium arsenide, indium phosphide, lead sulfide, other III-V compound semiconductor materials, and II-VI compound semiconductor materials. The semiconductor material of the bottom semiconductor layer 10 and the at least one top semiconductor portion 32 may be the same, or different. Typically, each of the bottom semiconductor layer 10 and the at least one top semiconductor portion 32 comprises a single crystalline semiconductor material. For example, the single crystalline semiconductor material may be silicon.

The bottom semiconductor layer 10 has a resistivity greater than 5 Ohms-cm, which includes, for example, p-doped single crystalline silicon having p-type dopants at an atomic concentration less than about $2.0 \times 10^{15}/cm^3$ or n-doped single crystalline silicon having n-type dopants at an atomic concentration less than about $1.0 \times 10^{15}/cm^3$. Preferably, the bottom semiconductor layer 10 has a resistivity greater than 50 Ohms-cm, which includes, for example, p-doped single crystalline silicon having p-type dopants at an atomic concentration less than about $2.0 \times 10^{14}/cm^3$ or n-doped single crystalline silicon having n-type dopants at an atomic concentration less than about $1.0 \times 10^{14}/cm^3$. More preferably, the bottom semiconductor layer 10 has a resistivity greater than 1 kOhms-cm, which includes, for example, p-doped single crystalline silicon having p-type dopants at an atomic concentration less than about $1.0 \times 10^{13}/cm^3$ or n-doped single crystalline silicon having n-type dopants at an atomic concentration less than about $5.0 \times 10^{12}/cm^3$. The high resistivity of the bottom semiconductor layer 10 reduces eddy current, thereby reducing parasitic coupling of radio frequency signal generated or propagated in the top semiconductor layer 30 with the bottom semiconductor layer 10. While silicon is used herein to illustrate the required dopant level for each threshold resistivity value for the bottom semiconductor layer 10, target dopant concentrations for other semiconductor materials may be readily obtained since each type of semiconductor material has a well established relationship between the dopant concentration and the resistivity of the semiconductor material.

The thickness of the bottom semiconductor layer 10 is typically from about 400 microns to about 1,000 microns, and typically from about 500 microns to about 900 microns at this step. If the bottom semiconductor layer 10 is subsequently thinned, the thickness of the bottom semiconductor layer 10 may be from about 50 microns to about 800 microns.

The buried insulator layer 20 comprises a dielectric material such as silicon oxide, silicon nitride, silicon oxynitride, or a combination thereof. The thickness of the buried insulator layer 20 may be from about 50 nm to about 500 nm, and typically from about 100 nm to about 300 nm, although lesser and greater thicknesses are also contemplated herein.

The shallow trench isolation structure 33 comprises a dielectric material such as silicon oxide, silicon nitride, silicon oxynitride, or a combination thereof. The shallow trench isolation structure 33 may be of unitary construction, i.e., in one piece. The shallow trench isolation structure 33 may laterally abut and surround each of the at least one top semiconductor portion 32.

The thickness of the top semiconductor layer 30 may be from about 20 nm to about 200 nm, and typically from about 40 nm to about 100 nm, although lesser and greater thicknesses are also contemplated herein.

The at least one top semiconductor portion 32 may be implanted with dopants of p-type or n-type. Typically, the dopant concentration of the at least one top semiconductor portion 32 is from about $1.0 \times 10^{15}/cm^3$ to about $1.0 \times 10^{18}/cm^3$, which corresponds to a dopant concentration for a body region of a field effect transistor.

At least two field effect transistors are formed on the at least one top semiconductor portion 32 by methods known in the art. Specifically, a gate dielectric 40, a gate electrode 42, and a gate spacer 44 are formed for each field effect transistor. A source region (not shown) and a drain region (not shown) are also formed in the at least one top semiconductor portion 32 for each field effect transistor by implanting dopants employing the gate electrode 42 and the gate spacer 44 of the field effect transistor as a self-aligning implantation mask.

A middle-of-line (MOL) dielectric layer 80 is formed on the at least two field effect transistors, the at least one top semiconductor portion 32, and the shallow trench isolation structure 33. The MOL dielectric layer 80 may comprise silicon oxide, silicon nitride, silicon oxynitride, an organosilicate glass (OSG), low-k chemical vapor deposition (CVD) oxide, a self-planarizing material such as a spin-on glass (SOG), and/or a spin-on low-k dielectric material such as SiLK™. Exemplary silicon oxides include undoped silicate glass (USG), borosilicate glass (BSG), phosphosilicate glass (PSG), fluorosilicate glass (FSG), borophosphosilicate glass (BPSG), or a combination thereof. The total thickness of the MOL dielectric layer 80, as measured from a top surface of the shallow trench isolation structure 33, may be from about 100 nm to about 10,000 nm, and typically from about 200 nm to about 5,000 nm. The top surface of the MOL dielectric layer 80 may be planarized, for example, by chemical mechanical planarization.

Figure 3:
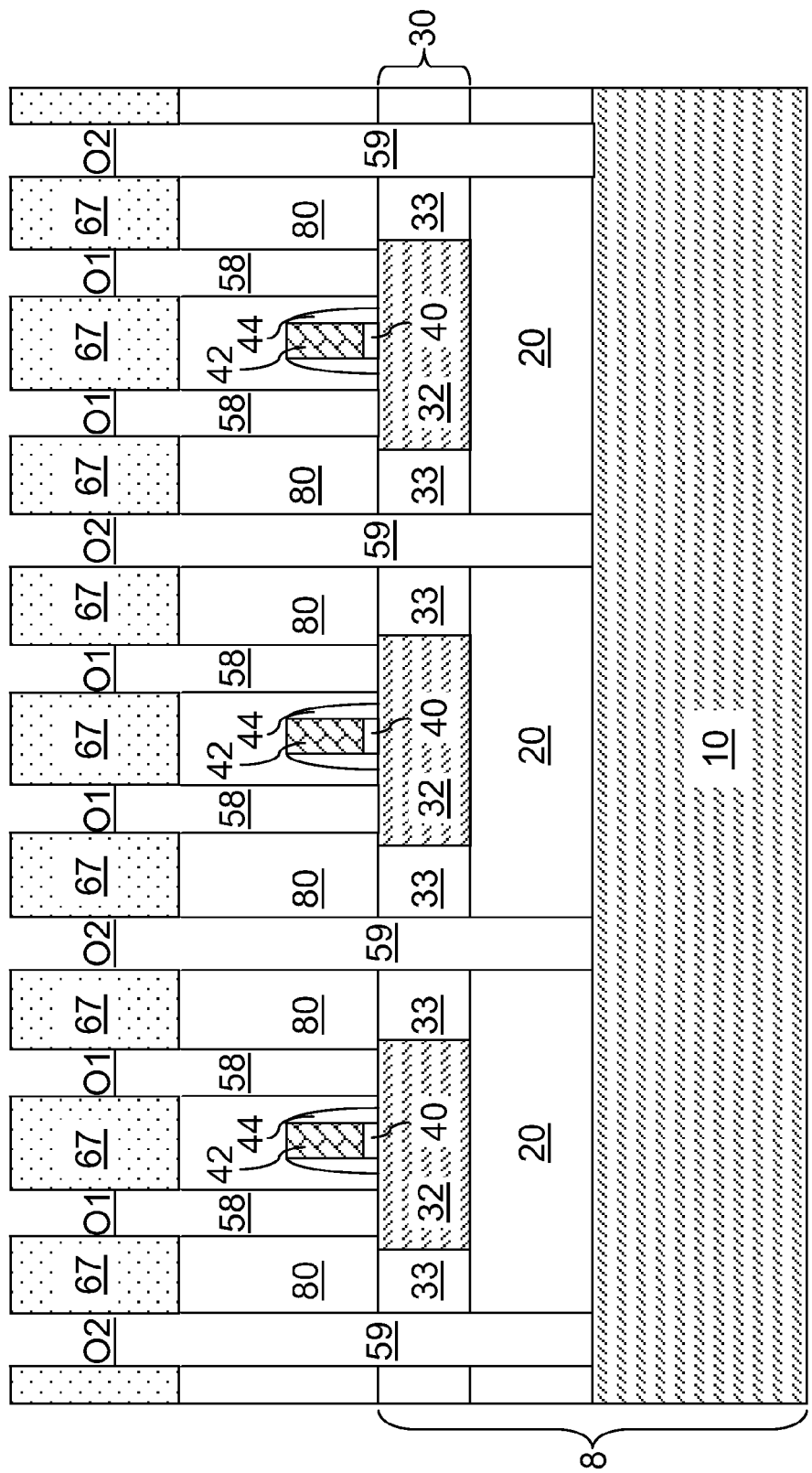

Referring to FIG. 3, a photoresist 67 is applied to a top surface of the MOL dielectric layer 80 and lithographically patterned to form openings. The openings include first openings O1 that overlie the at least one top semiconductor portion 32 and at least one second opening O2 that overlie the shallow trench isolation structure 33. Each of the first openings O1 is located inside the area of the at least one top semiconductor portion 32 and outside the area of the shallow trench isolation structure 33 in a see-through top-down view. Each of the at least one second opening O2 is located outside the area of the at least one top semiconductor portion 32 and inside the area of the shallow trench isolation structure 33 in the see-through top-down view.

The pattern of the first openings O1 and the at least one second opening O2 in the photoresist 67 is transferred into the MOL dielectric layer 80 by an anisotropic etch, which may be a reactive ion etch. The photoresist 67 is employed as an etch mask for the anisotropic etch. First via cavities 58 are formed underneath the first openings O1 in the photoresist 67, and at least one second via cavity 59 is formed underneath the at least one second opening O2 in the photoresist 67.

Preferably, the anisotropic etch is selective to the semiconductor material of the at least one top semiconductor portions 32. The anisotropic etch proceeds until a top surface of the at least one top semiconductor portion 32 is exposed at a bottom of the first via cavities 58. At this point, the top surface of the shallow trench isolation structure 33 is exposed at a bottom of the at least one second via cavity 59. The anisotropic etch proceeds further to remove the dielectric material of the shallow trench isolation structure 33 and the dielectric material of the buried insulator layer 20. If the anisotropic etch is selective to the semiconductor material of the at least one semiconductor portion 32, the depth of the first via cavities does not change while the at least one second via cavity 59 extends further downward to the top surface of the bottom semiconductor layer 10. Preferably, the anisotropic etch is selective to the semiconductor material of the bottom semiconductor layer 10. For example, if the at least one top semiconductor portions 32 and the bottom semiconductor layer 10 comprise silicon, an anisotropic etch that removes dielectric material, such as silicon oxide, selective to silicon may be employed to provide a selective etch that stops on the top surface(s) of the at least one top semiconductor portion 32 and the top surface of the bottom semiconductor layer 10.

A top surface of the at least one top semiconductor portion 32 is exposed at the bottom of each of the first via cavities 58. A top surface of the bottom semiconductor layer 10 is exposed at the bottom of each of at least one second via cavity 59. The first via cavities 58 are formed within the MOL dielectric layer 80, and extend from the top surface of the MOL dielectric layer 80 to a top surface of the top semiconductor layer 30, which coincides with the bottom surface of the MOL dielectric layer 80. Each of the at least one second via cavity 59 is formed within the MOL dielectric layer 80, the shallow trench isolation structure 33, and the buried insulator layer 20. Each of the at least one second via cavity 59 extends from a top surface of the MOL dielectric layer 80, through the MOL dielectric layer 80, the shallow trench isolation structure 33, and the buried insulator layer 20, and to a top surface of the bottom semiconductor layer 10. The photoresist 67 is subsequently removed.

The sidewalls of each of the at least one second via cavity 59 may be substantially vertically coincident from the top surface of the MOL dielectric layer 80 to the top surface of the bottom semiconductor layer 10. In other words, the portions of the sidewalls of each of the at least one second via cavity 59 in the MOL dielectric layer 80, the shallow trench isolation structure 33, and the buried insulator layer 20 may overlap one another in a top-down view. In case a taper is present in the sidewalls of the at least one second via cavity 59, the angle of taper may be from about 0 degree to about 5 degrees, and typically from 0 degree to about 2 degrees, although greater taper angles are also contemplated herein.

The depth of each of the at least one second via cavity 59 is equal to the sum of the thickness of the buried insulator layer 20, the thickness of the top semiconductor layer 30, and the thickness of the MOL dielectric layer 80. The depth of each of the first via cavities 58 is equal to the thickness of the MOL dielectric layer 80.

In a first configuration of the first exemplary semiconductor structure, the at least one second via cavity 59 is an array of via cavities. Each via cavity in the array of via cavities is a discrete via cavity that does not abut another via cavity.

In a second configuration of the first exemplary semiconductor structure, the at least one second via cavity 59 is a single via cavity having a plurality of via cavity portions that are interconnected among one another. In other words, the at least one second via cavity 59 includes a plurality of via cavity portions that are laterally connected between the top surface of the MOL dielectric layer 80 and a top surface of the bottom semiconductor layer 10.

While the present invention is described for simultaneous formation of the first via cavities 58 and the at least one second via cavity 59, embodiments in which the first via cavities 58 and the at least one second via cavity 59 are formed with two separate lithographic steps and two separate anisotropic etches are also contemplated herein. In this case, formation of the at least one second via cavity 59 may precede, or follow, formation of the first via cavities 58.

Figure 4:
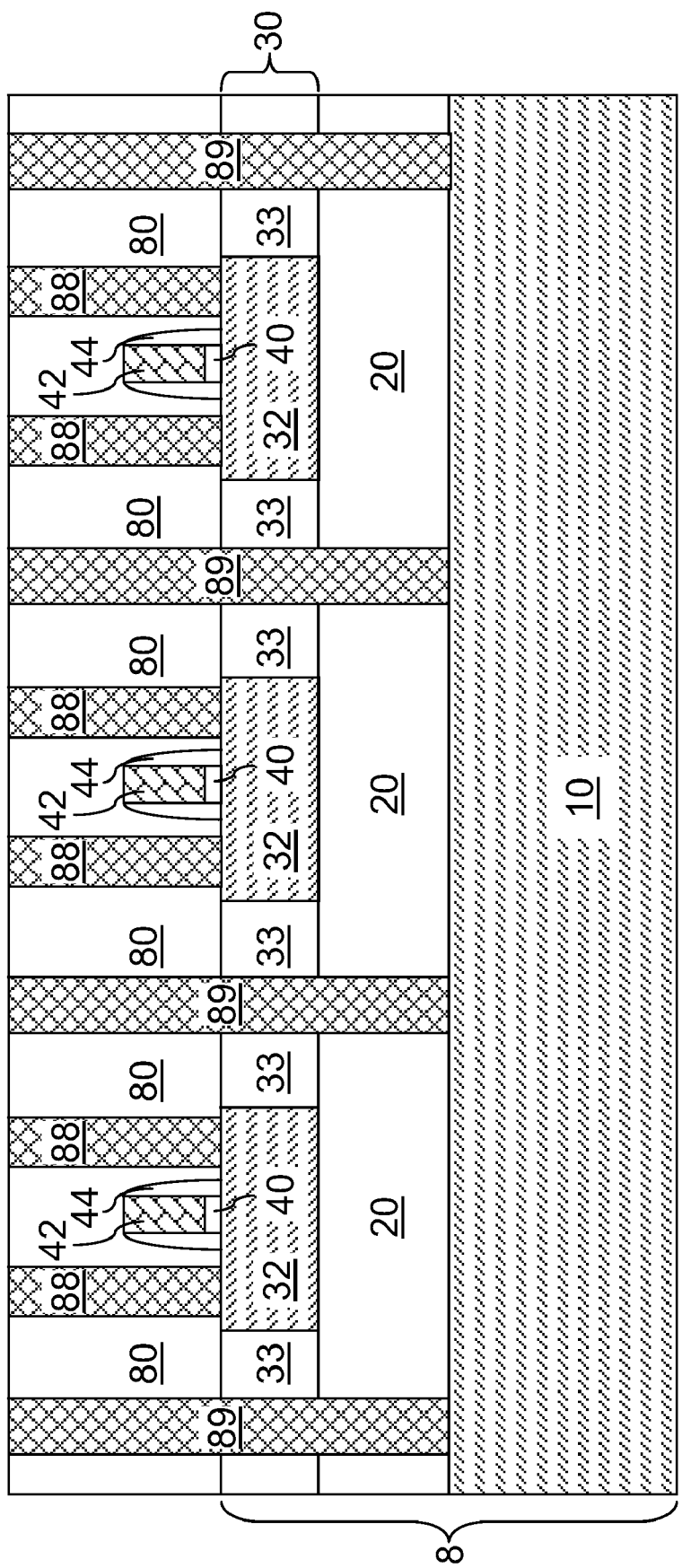
Figure 5:
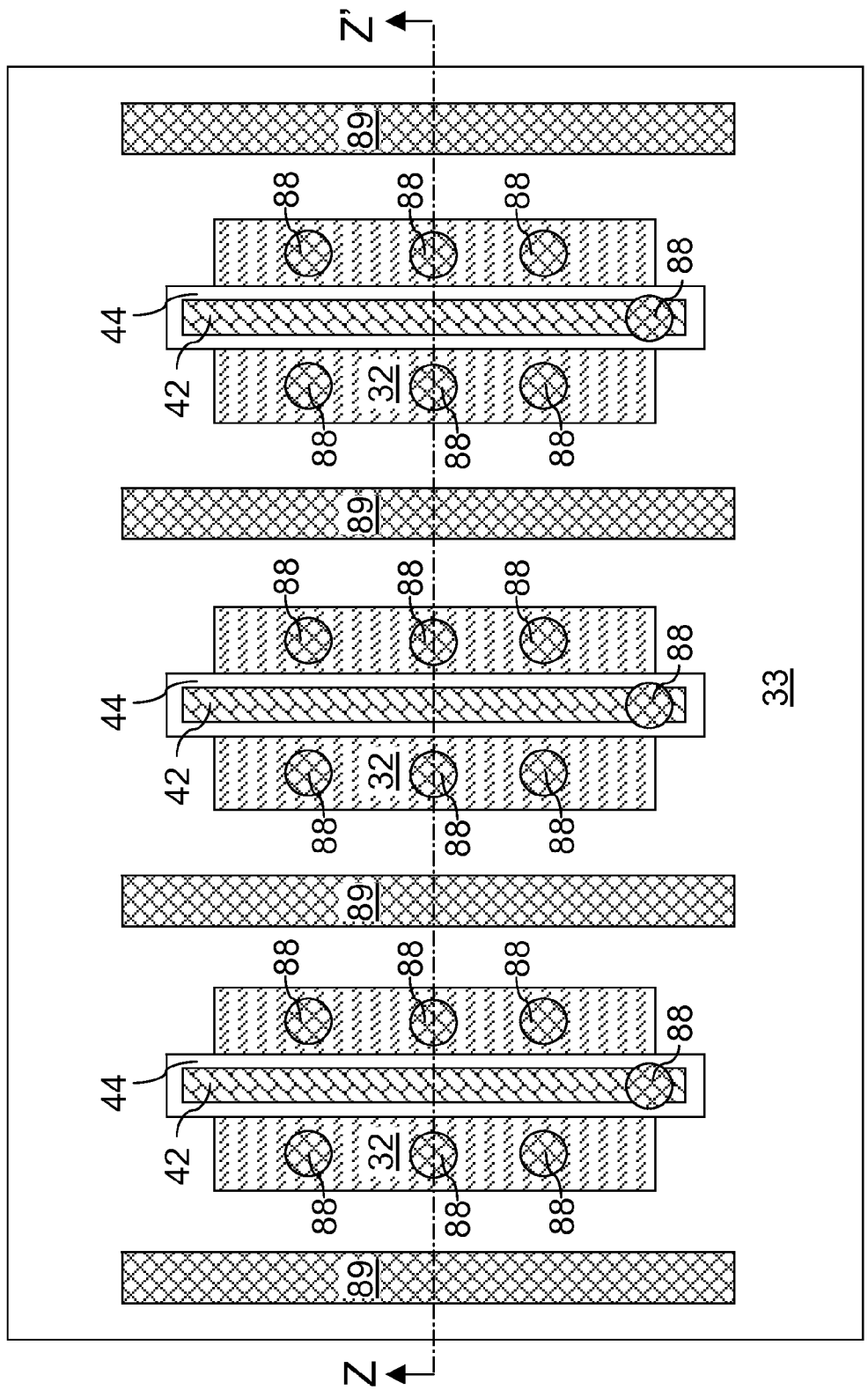
Figure 6:
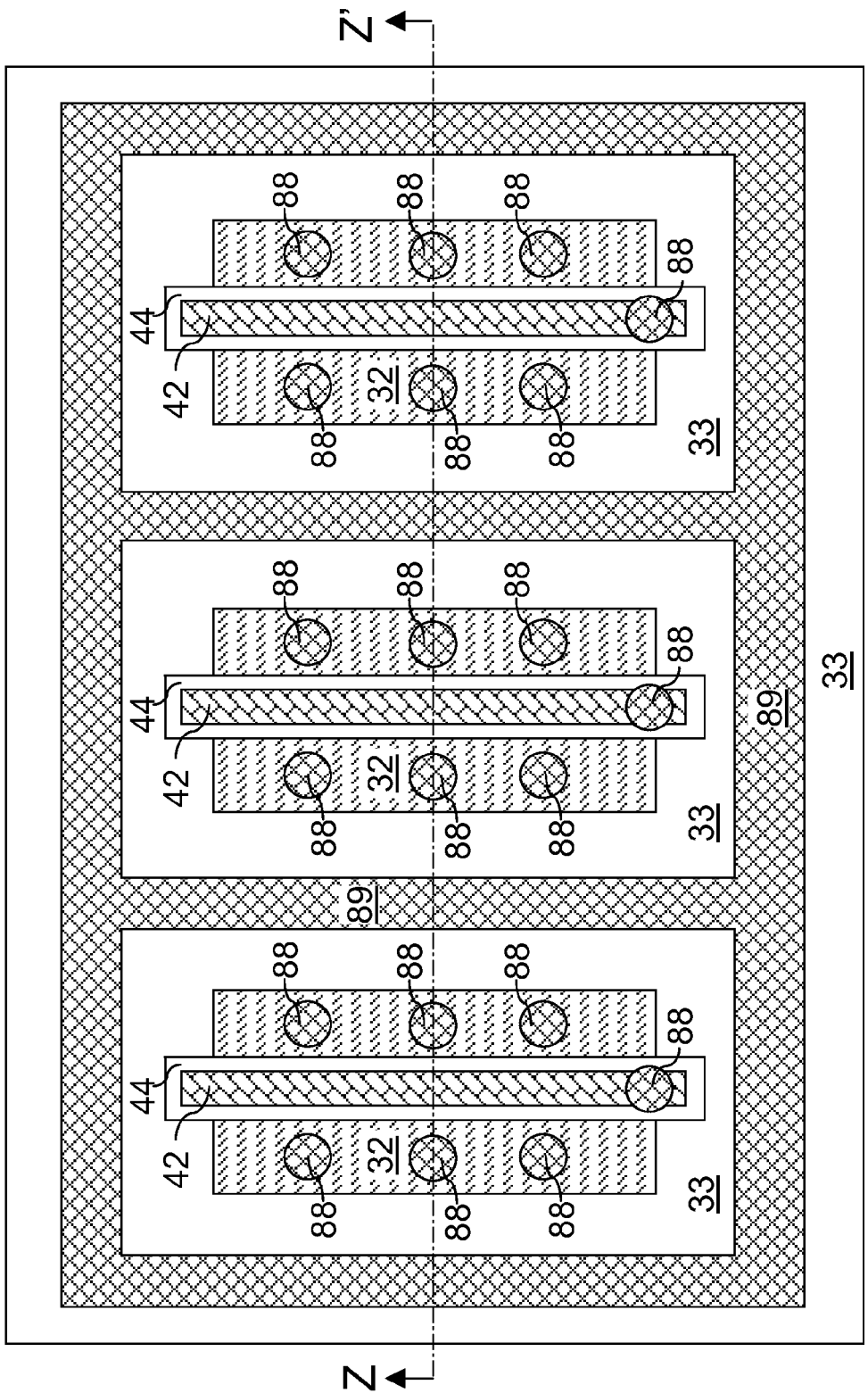

Referring to FIGS. 4, 5, and 6, first conductive vias 88 and at least one second conductive via 89 are formed in the MOL dielectric layer 80. FIG. 4 is a common vertical cross-sectional view of a first configuration of the first exemplary semiconductor structure shown in FIG. 5 and a second configuration of the first exemplary semiconductor structure shown in FIG. 6. FIG. 5 is a modified top-down view of the first configuration of the first exemplary semiconductor structure in which the MOL dielectric layer 80 is omitted for clarity. FIG. 6 is a modified top-down view of the second configuration of the first exemplary semiconductor structure in which the MOL dielectric layer 80 is omitted for clarity.

The plane Z-Z' in FIGS. 5 and 6 corresponds to the plane of the vertical cross-section for the common vertical cross-sectional view of the first exemplary semiconductor structure shown in FIG. 4.

Specifically, a conductive material is deposited into the first via cavities 58 and the at least one second via cavity 59. The conductive material may be a doped semiconductor material or a metallic material. For example, the conductive material may be doped polysilicon, a doped silicon-containing semiconductor material, a doped compound semiconductor material, an elemental metal, an alloy of at least two elemental metals, a conductive metal nitride, etc. The excess conductive material above the top surface of the MOL dielectric layer 80 is removed, for example, by chemical mechanical planarization (CMP), recess etch, or a combination thereof. The remaining portions of the conductive material in the first via cavities 58 constitute first conductive vias 88, and the remaining portion(s) of the conductive material in the at least one second via cavity 59 constitute(s) at least one second conductive via 89. The first conductive vias 88 may be formed directly on the source regions (not shown separately), the drain regions (not shown separately) and the gate electrodes 42 of the at least two field effect transistors. The source regions and the drain regions are located in the at least one top semiconductor portion 32. Each of the at least one second conductive via 89 extends from a top surface of the MOL dielectric layer 80 to the top surface of the bottom semiconductor layer 10.

Each of the at least one second conductive via 89 extends from a top surface of the MOL dielectric layer 80 through the MOL dielectric layer 80, the shallow trench isolation structure 33, the buried insulator layer 20, and to a top surface of a bottom semiconductor layer 10 of the SOI substrate 8, and is interposed between at least two field effect transistors and separates the at least two field effect transistors. In this case, each of the at least one second conductive via 89 is of unitary construction.

In the first configuration of the first exemplary semiconductor structure shown in FIGS. 4 and 5, the at least one second conductive via 89 is an array of conductive vias. Each conductive via in the array of the conductive vias is disjoined from other conductive vias, i.e., does not abut another conductive via.

In the second configuration of the first exemplary semiconductor structure shown in FIGS. 4 and 6, the at least one second conductive via 89 is a single conductive via having a plurality of conductive via portions that are interconnected among one another. In other words, the at least one second conductive via 89 includes a plurality of conductive via portions that are laterally connected between the top surface of the MOL dielectric layer 80 and the top surface of the bottom semiconductor layer 10.

In the second configuration, the at least one second conductive via 89 is a single contact via of unitary construction, i.e., in one contiguous piece, and laterally surrounds the entirety of the at least two field effect transistors. In case the at least two field effect transistors include more than two field effect transistors, all of the plurality of field effect transistors may be laterally enclosed by the single contact via.

Figure 7:
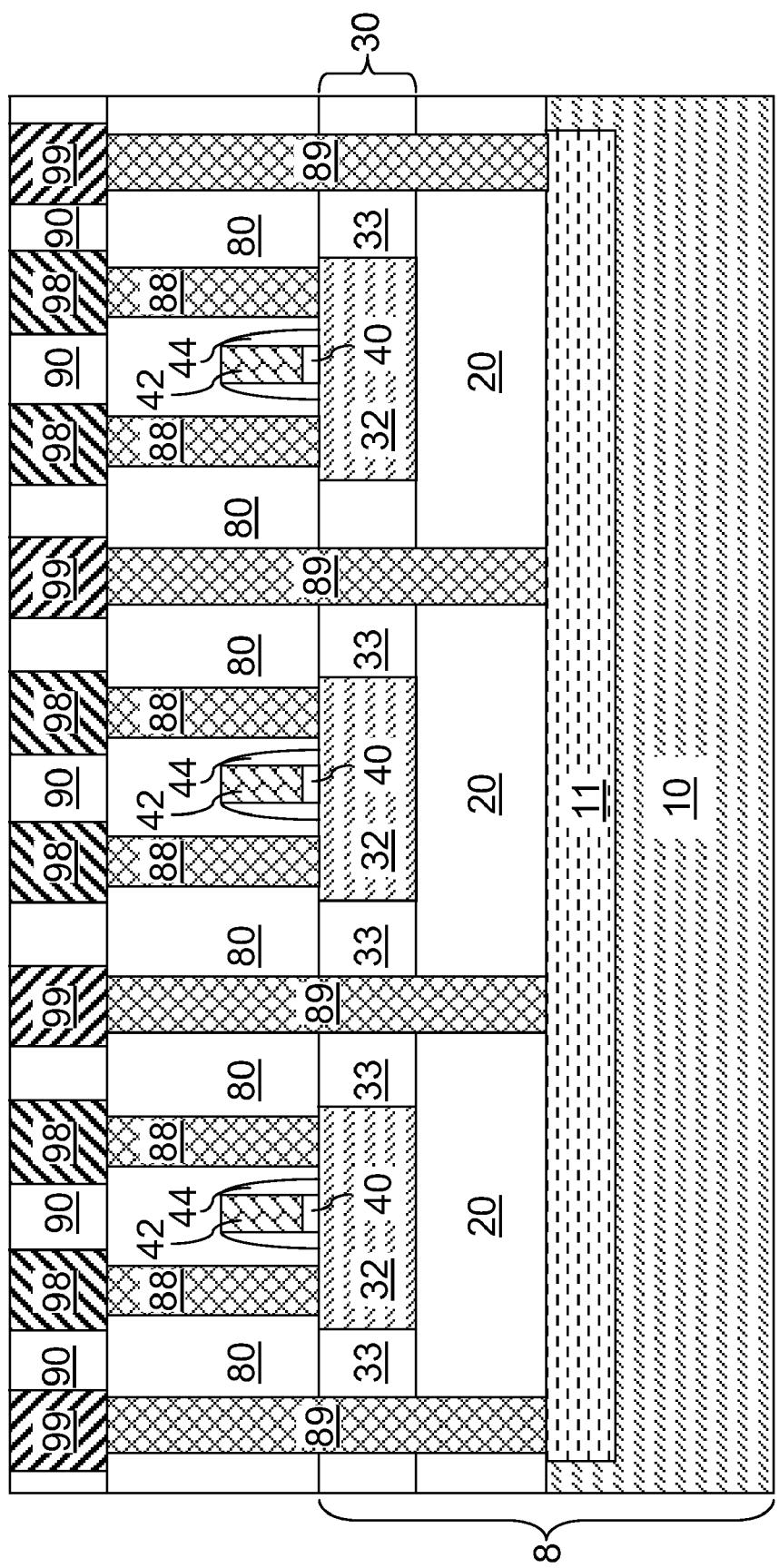
Figure 8:
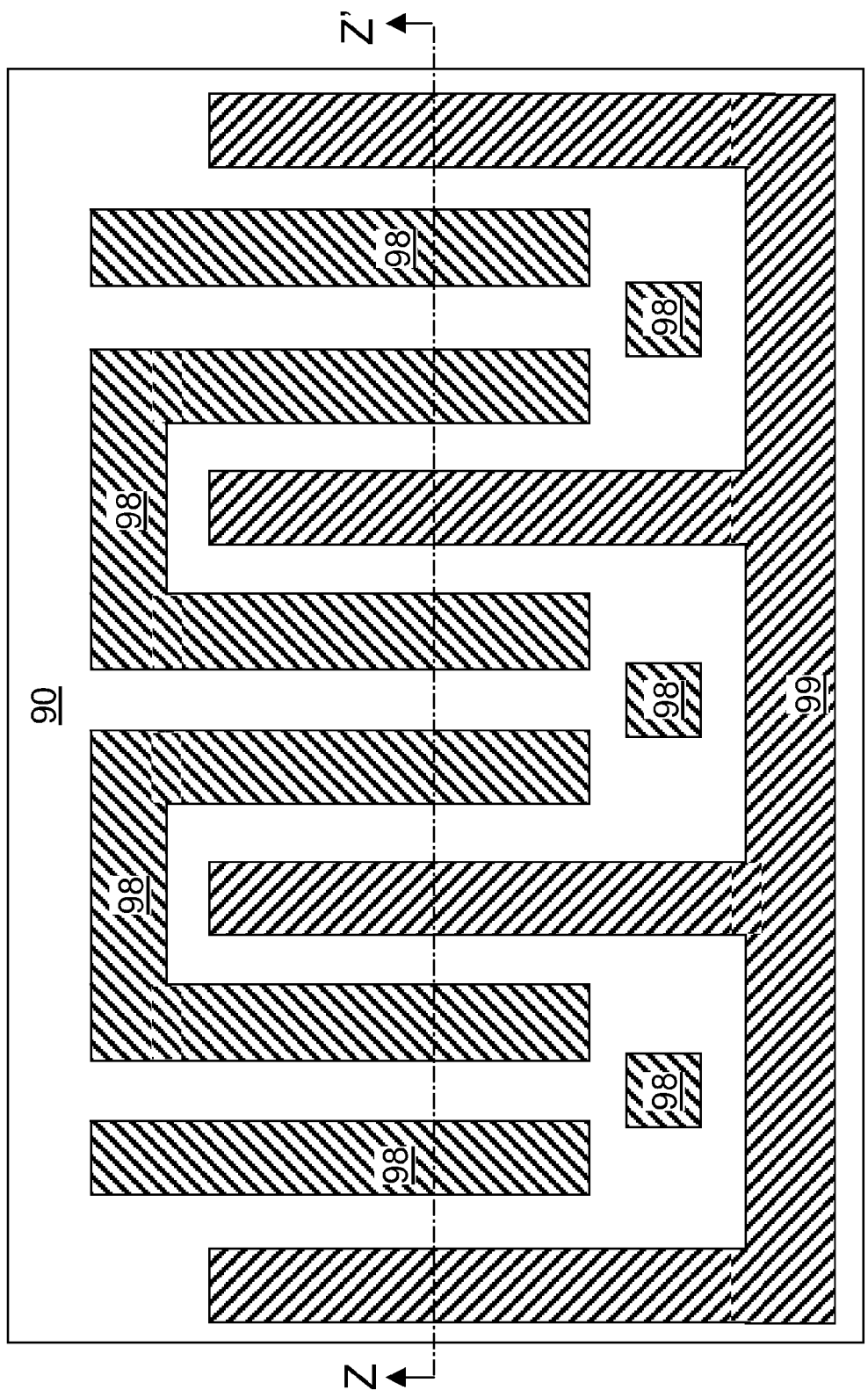
Figure 9:
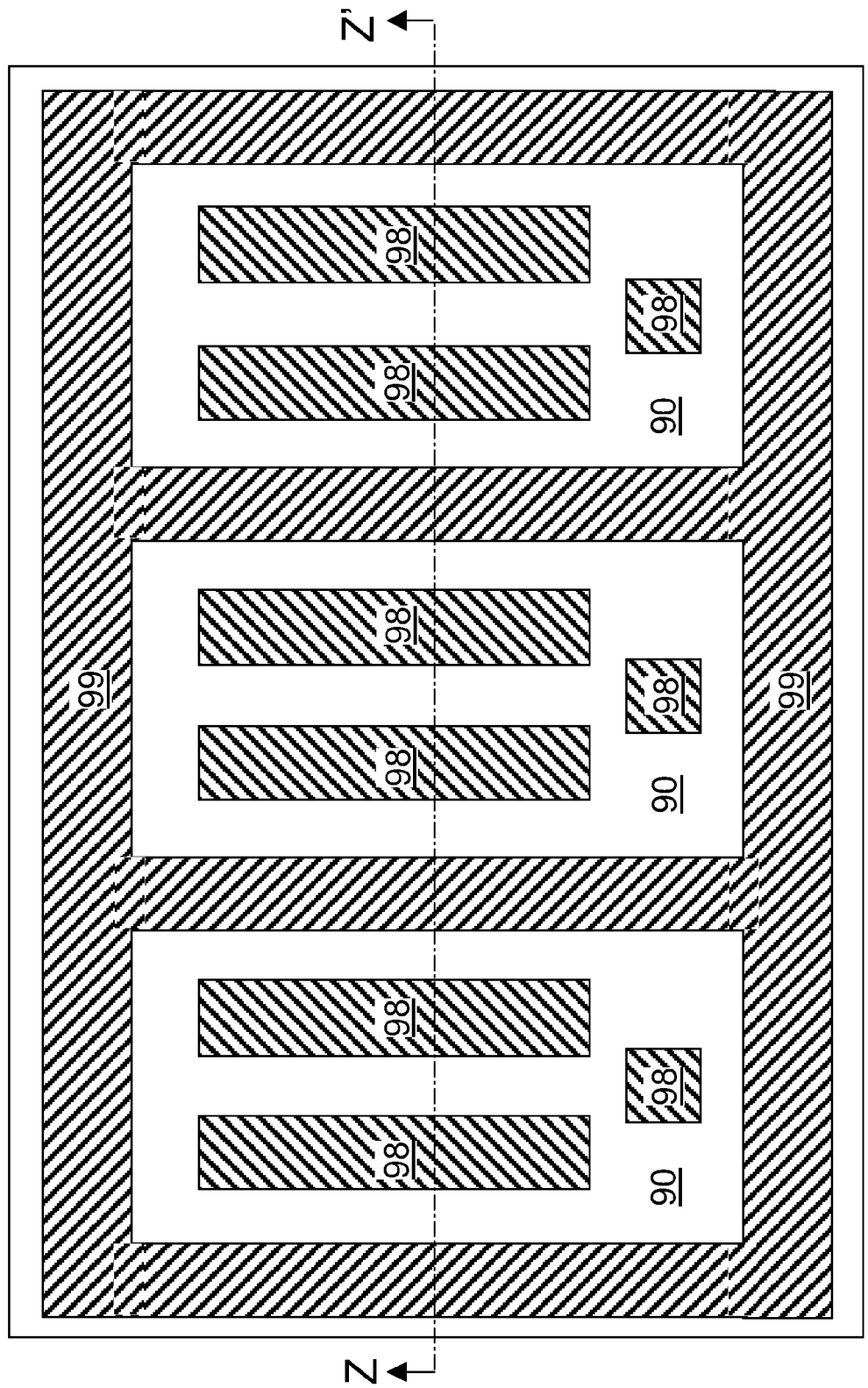

Referring to FIGS. 7, 8, and 9, an interconnect-level dielectric layer 90, first interconnect-level metal lines 98, and a second interconnect-level metal line 99 are formed. FIG. 7 is a common vertical cross-sectional view of the first configuration of the first exemplary semiconductor structure shown in FIG. 8 and the second configuration of the first exemplary semiconductor structure shown in FIG. 9. FIG. 7 is a top-down view of the first configuration of the first exemplary semiconductor structure. FIG. 8 is a top-down view of the second configuration of the first exemplary semiconductor structure. The plane Z-Z' in FIGS. 8 and 9 corresponds to the plane of the vertical cross-section for the common vertical cross-sectional view of the first exemplary semiconductor structure shown in FIG. 7.

The dielectric material for the interconnect-level dielectric layer 90 may comprise any of the dielectric materials that may be employed for the MOL dielectric layer 80 as described above. The thickness of the interconnect-level dielectric layer 90 may be from about 75 nm to about 1,000 nm, and typically from about 150 nm to about 500 nm, although lesser and greater thicknesses are also contemplated herein.

The first interconnect-level metal lines 98 and the second interconnect-level metal line 99 are embedded in the interconnect-level dielectric layer 90, and may be formed by deposition of a metallic material and a subsequent planarization. The metallic material of the first interconnect-level metal lines 98 and the second interconnect-level metal line 99 may be deposited by physical vapor deposition (PVD), electroplating, electroless plating, chemical vapor deposition, or a combination thereof.

Each of the first conductive vias 88 vertically abuts one of the first interconnect-level metal lines 98. Each of the at least one second conductive via 89 vertically abuts the second interconnect-level metal line 99. A constant bias voltage may be applied to bottom semiconductor layer 10 through the at least one second conductive via 89 and the second interconnect-level metal line 99. The magnitude and/or polarity of the constant bias voltage may be determined by a radio frequency signal applied to at least one of the at least two field effect transistors. The RF signal may be applied to only one or more depending on whether each transistor is turned on or off. For example, the constant voltage may be a voltage that is equal to or less than a first voltage at a maximum positive swing of the RF signal and is equal to or greater than a second voltage at a maximum negative swing of the RF signal. The second interconnect-level metal line 99 may be electrically connected to a constant voltage source or electrical ground by an additional metal interconnect structure (not shown).

In the first configuration of the first exemplary semiconductor structure shown in FIGS. 7 and 8, the at least one second conductive via 89 is an array of conductive vias. Each conductive via in the array of the conductive vias vertically abuts the second interconnect-level metal line 99. Sources and drains of the plurality of field effect transistors may be wired by the first interconnect-level metal lines 98 within the interconnect-level dielectric layer 90, i.e., in a single wiring level.

In the second configuration of the first exemplary semiconductor structure shown in FIGS. 7 and 9, the at least one second conductive via 89 is a single conductive via having a plurality of conductive via portions that are interconnected among one another. The single contact via is of unitary construction and laterally surrounds the entirety of the at least two field effect transistors. The single conductive via vertically abuts the second interconnect-level metal line 99.

The first and second configurations of the first exemplary semiconductor structure includes the at least two field effect transistors, which may constitute a radio frequency switch for a signal having a frequency from about 3 Hz to about 300 GHz. Particularly, the at least two field effect transistors may constitute a radio frequency switch that is capable of operating at VHF, UHF, SHF, and EHF.

At such high frequencies, capacitive coupling between the at least two field effect transistors and the bottom semiconductor layer 10 may become significant since the capacitive coupling increases linearly with frequency. The radio frequency signal in the at least two field effect transistors causes formation of an induced charge layer 11 in an upper portion of the bottom semiconductor layer 10. The induced charge layer 11 is formed directly underneath the buried insulator layer 11, and includes positive charges or negative charges.

Specifically, the electrical charges in the induced charge layer 11 changes polarity at the signal frequency of the radio signal in the at least two field effect transistors. When the voltage in the at least two field effect transistors is positive relative to the bottom semiconductor layer 10, electrons accumulate in the induced charge layer 11. When the voltage in the at least two field effect transistors is negative relative to the bottom semiconductor layer 10, holes accumulate in the induced charge layer 11. Depending on the type of majority charge carriers in the bottom semiconductor layer 10, which is determined by the conductivity of the bottom semiconductor layer 10, the induced charge layer 11 may be in a depletion mode having a net charge that is the opposite type of the conductivity of the bottom semiconductor layer 10, or may be in an inversion mode having a net charge that is the same type as the conductivity type of the bottom semiconductor layer 10.

Further, the thickness of the induced charge layer 11 changes in time at the signal frequency in the at least two field effect transistors. In other words, the frequency of the thickness change in the induced charge layer 11 is the radio frequency of the signal in the at least two field effect transistors.

The at least one second conductive via 89 provides a low resistive electrical discharge path for the induced charges in the induced charge layer 11. Since the at least one second conductive via 89 is formed through the shallow trench isolation structure 33 that laterally abuts and surrounds the at least one top semiconductor portion 32, the at least one second conductive via 89 is placed in close proximity to the at least two field effect transistors. Further, the at least one second conductive via 89 lands directly on the induced charge layer 11, i.e., makes physical and electrical contact with the induced charge layer 11 as the at least one conductive via 89 vertically abuts the induced charge layer 11.

Compared with any other lateral electrical path through the bottom semiconductor layer 10 that the prior art structures disclose, the first exemplary semiconductor structure of the present invention provides a vertical electrical path to a constant voltage source or electrical ground through the at least one second conductive via 89 that directly contacts the source of the parasitic charge, i.e., the induced charge layer 11. The at least one second conductive via 89 provides a low resistance electrical discharge path for fast discharge of charge carriers in the induced charge layer 11 so that thickness of the induced charge layer 11 and the amount of accumulated charge in the induced charge layer 11 are minimized. By reducing the amount of electrical charges in the induced charge layer 11, the present invention reduces secondary capacitive coupling between two disconnected portions of a radio frequency switch when the switch is turned off. Thus, the radio frequency switch provides more effective signal isolation in the off state.

The second configuration of the first exemplary semiconductor structure further provides an additional advantage of providing an electrical shield that laterally surrounds each of the at least two field effect transistors individually. The at least one second conductive via 89 laterally surrounds each of the at least two field effect transistors and functions as a signal shield maintained at a constant voltage or an electrically grounding wall that significantly reduces parasitic coupling between adjoining devices among the at least two field effect transistors, thereby enhancing the efficiency of the at least two field effect transistors as a radio frequency switch in an off state.

Figure 10:
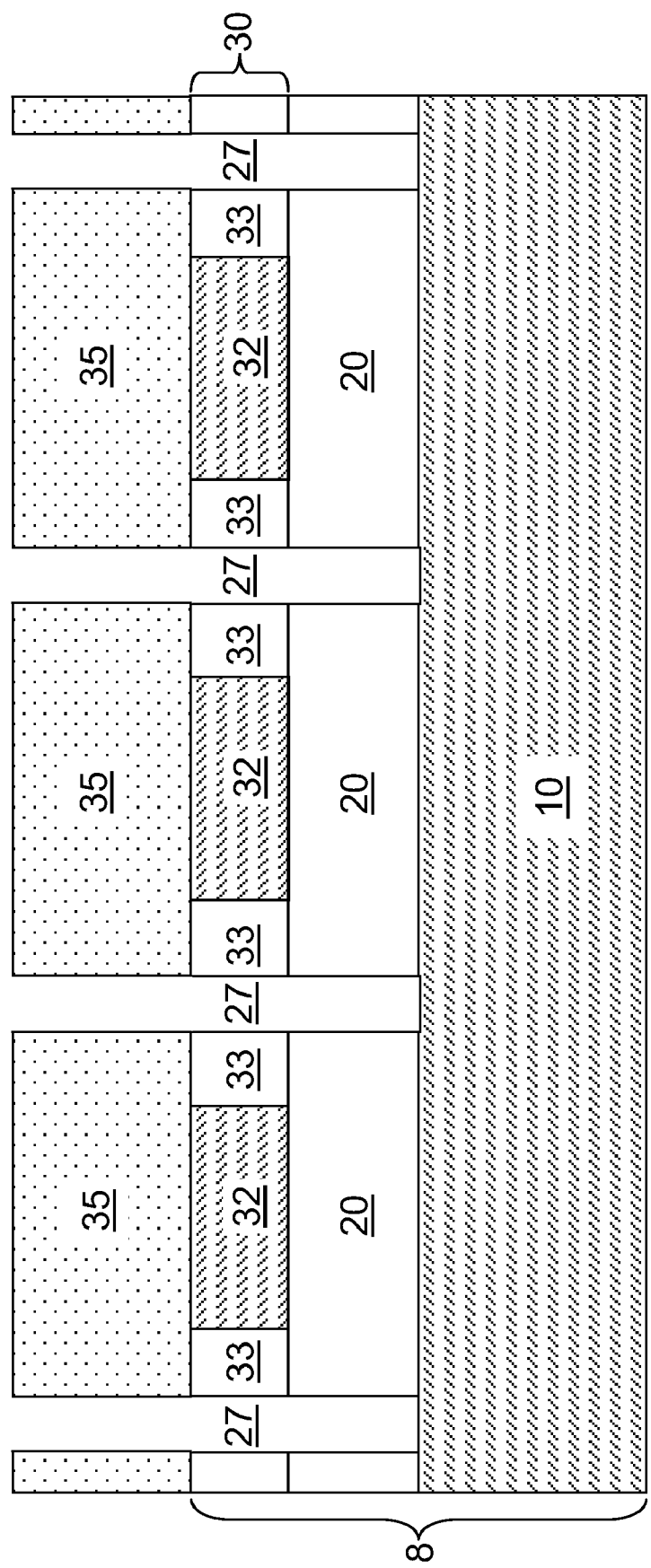
FIGS. 10-18 are various views of a second exemplary semiconductor structure according to a second embodiment of the present invention.

Referring to FIG. 10, a second exemplary semiconductor structure according to a second embodiment of the present invention comprises a semiconductor substrate 8, which includes a bottom semiconductor layer 10, a buried insulator layer 20, and a top semiconductor layer 30. The top semiconductor layer 30 includes at least one top semiconductor portion 32 and a shallow trench isolation structure 33.

The composition and the thickness of the bottom semiconductor layer 10, the buried insulator layer 20, and the top semiconductor layer 30 may be the same as in the first embodiment. The resistivity of the bottom semiconductor layer 10 may also be the same as in the first embodiment.

A photoresist 35 is applied to a top surface of the top layer 30 and lithographically patterned to form openings. The openings in the photoresist 35 overlie the shallow trench isolation structure 33. Each of the openings is located outside the area of the at least one top semiconductor portion 32 and inside the area of the shallow trench isolation structure 33 in a top-down view.

The pattern of the openings in the photoresist 35 is transferred into the shallow trench isolation structure 33 and the buried insulator layer 20 by an anisotropic etch, which may be a reactive ion etch. The photoresist 35 is employed as an etch mask for the anisotropic etch. At least one lower via cavity 27 is formed underneath the openings in the photoresist 35.

Preferably, the anisotropic etch is selective to the semiconductor material of the semiconductor material of the bottom semiconductor layer 10. For example, if the bottom semiconductor layer 10 comprises silicon, an anisotropic etch that removes dielectric material, such as silicon oxide, selective to silicon may be employed to provide an anisotropic etch that stops on the top surfaces of the top surface of the bottom semiconductor layer 10.

The top surface of the bottom semiconductor layer 10 is exposed at the bottom of each of the at least one lower via cavity 27. Each of the at least one lower via cavity 27 is formed within the shallow trench isolation structure 33 and the buried insulator layer 20. Each of the at least one lower via cavity 27 extends from a top surface of the shallow trench isolation structure 33, through the shallow trench isolation structure 33 and the buried insulator layer 20, and to a top surface of the bottom semiconductor layer 10. The photoresist 35 is subsequently removed.

The sidewalls of each of the at least one lower via cavity 27 may be substantially vertically coincident from the top surface of the shallow trench isolation structure 33 to the top surface of the bottom semiconductor layer 10. In other words, the portions of the sidewalls of each of the at least one lower via cavity 27 in the shallow trench isolation structure 33 and the buried insulator layer 20 may overlap each other in a top-down view. In case a taper is present in the sidewalls of the at least one lower via cavity 27, the angle of taper may be from about 0 degree to about 5 degrees, and typically from 0 degree to about 2 degrees, although greater taper angles are also contemplated herein. The depth of each of the at least one lower via cavity 27 is equal to the sum of the thickness of the buried insulator layer 20 and the thickness of the top semiconductor layer 30.

In a first configuration of the second exemplary semiconductor structure, the at least one lower via cavity 27 is an array of via cavities. Each via cavity in the array of via cavities is a discrete via cavity that does not abut another via cavity.

In a second configuration of the second exemplary semiconductor structure, the at least one lower via cavity 27 is a single via cavity having a plurality of via cavity portions that are interconnected among one another. In other words, the at least one lower via cavity 27 includes a plurality of via cavity portions that are laterally connected between the top surface of the shallow trench isolation structure 33 and a top surface of the bottom semiconductor layer 10.

Figure 11:
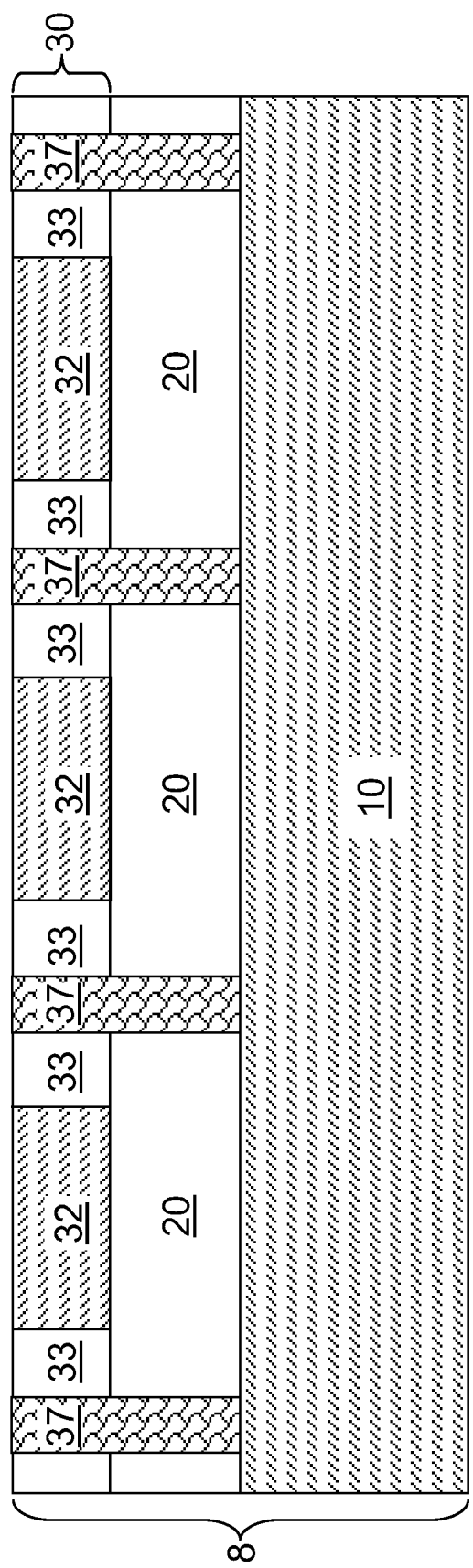
Figure 12:
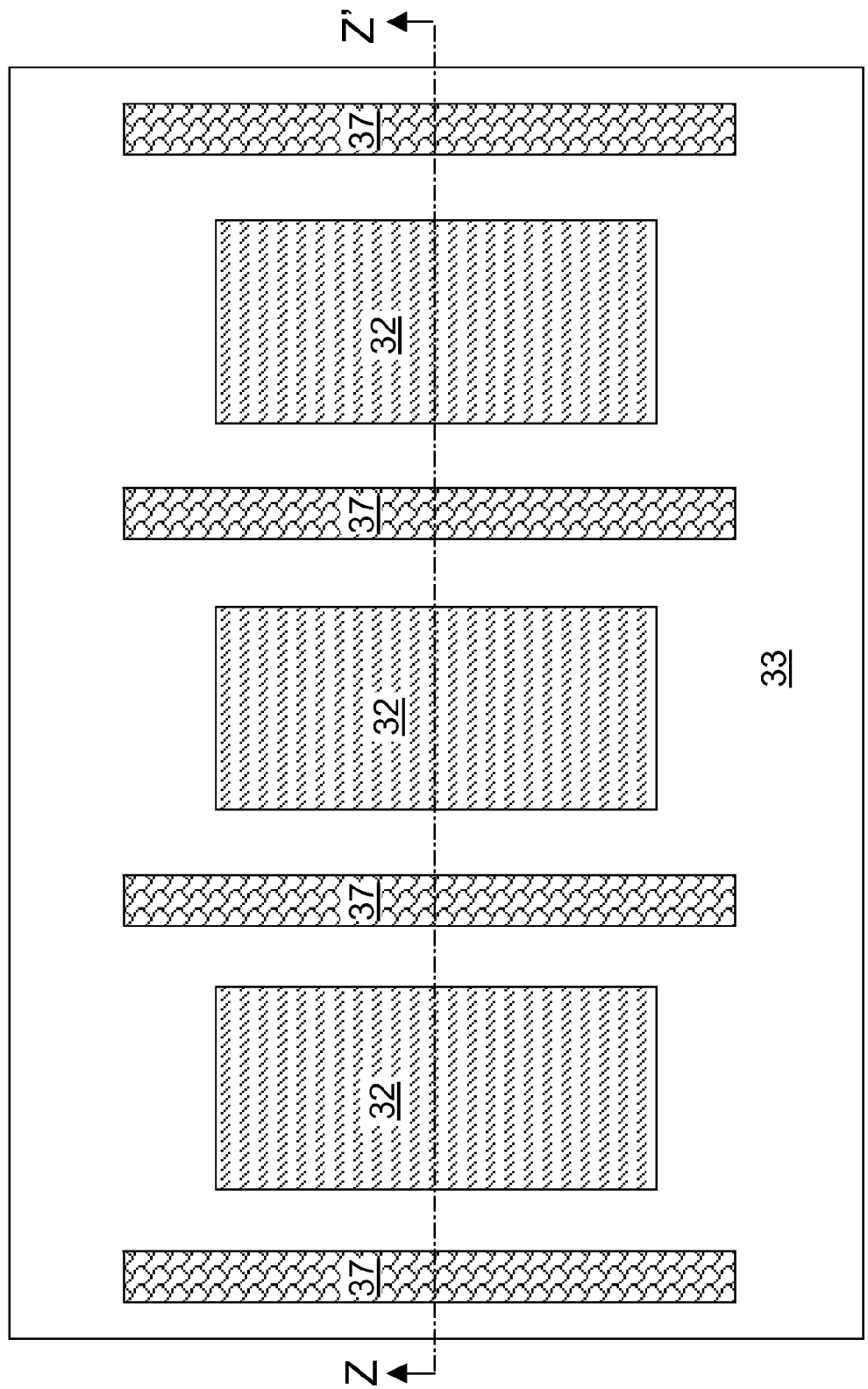
Figure 13:
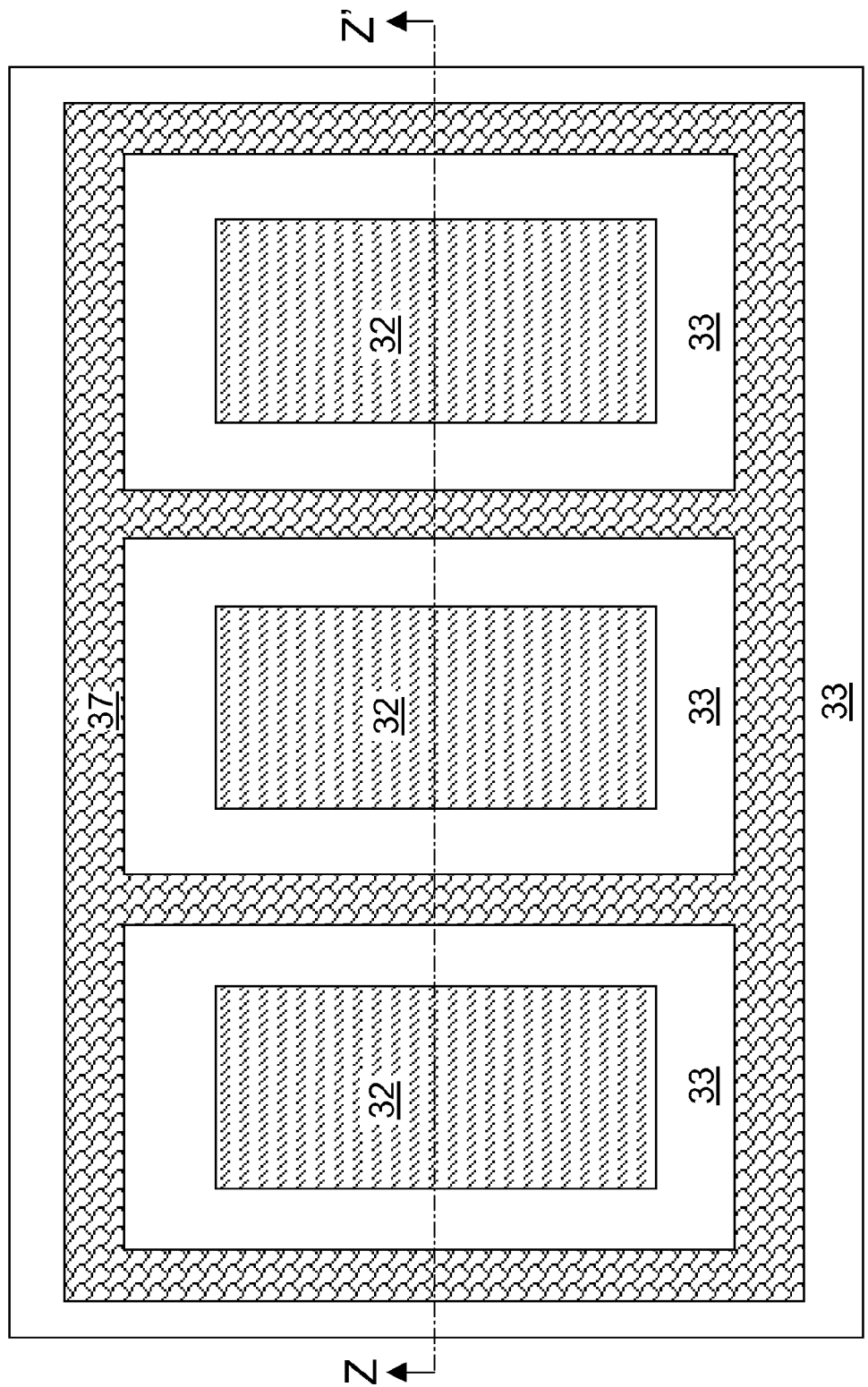

Referring to FIGS. 11, 12, and 13, at least one lower conductive via 37 is formed within the at least one lower via cavity 27 in the shallow trench isolation structure 33 and the buried insulator layer 20. FIG. 11 is a common vertical cross-sectional view of a first configuration of the second exemplary semiconductor structure shown in FIG. 12 and a second configuration of the second exemplary semiconductor structure shown in FIG. 13. FIG. 12 is a top-down view of the first configuration of the second exemplary semiconductor structure. FIG. 13 is a top-down view of the second configuration of the second exemplary semiconductor structure. The plane Z-Z' in FIGS. 12 and 13 corresponds to the plane of the vertical cross-section for the common vertical cross-sectional view of the second exemplary semiconductor structure shown in FIG. 11.

Specifically, a conductive material is deposited into the at least one lower via cavity 27. The conductive material may be a doped semiconductor material or a metallic material. For example, the conductive material may be doped polysilicon, a doped silicon-containing semiconductor material, a doped compound semiconductor material, an elemental metal, an alloy of at least two elemental metals, a conductive metal nitride, etc. The excess conductive material above the top surface of the top semiconductor layer 30 is removed, for example, by chemical mechanical planarization (CMP), recess etch, or a combination thereof. The remaining portions of the conductive material in the at least one lower via cavity 27 constitute the at least one lower conductive via 37. Each of the at least one lower conductive via 37 extends from a top surface of the shallow trench isolation structure 33 to the top surface of the bottom semiconductor layer 10.

In the first configuration of the second exemplary semiconductor structure shown in FIGS. 11 and 12, the at least one lower conductive via 37 is an array of conductive vias. Each conductive via in the array of the conductive vias is disjoined from other conductive vias, i.e., does not abut another conductive via.

In a second configuration of the second exemplary semiconductor structure shown in FIGS. 11 and 13, the at least one lower conductive via 37 is a single conductive via having a plurality of conductive via portions that are interconnected among one another. In other words, the at least one lower conductive via 37 includes a plurality of conductive via portions that are laterally connected between the top surface of the shallow trench isolation structure 33 and the top surface of the bottom semiconductor layer 10.

In the second configuration, the at least one lower conductive via 37 is a single contact via of unitary construction, i.e., in one contiguous piece, and laterally surrounds the entirety of the at least one top semiconductor portion 32 in which at least two field effect transistors are subsequently formed.

Figure 14:
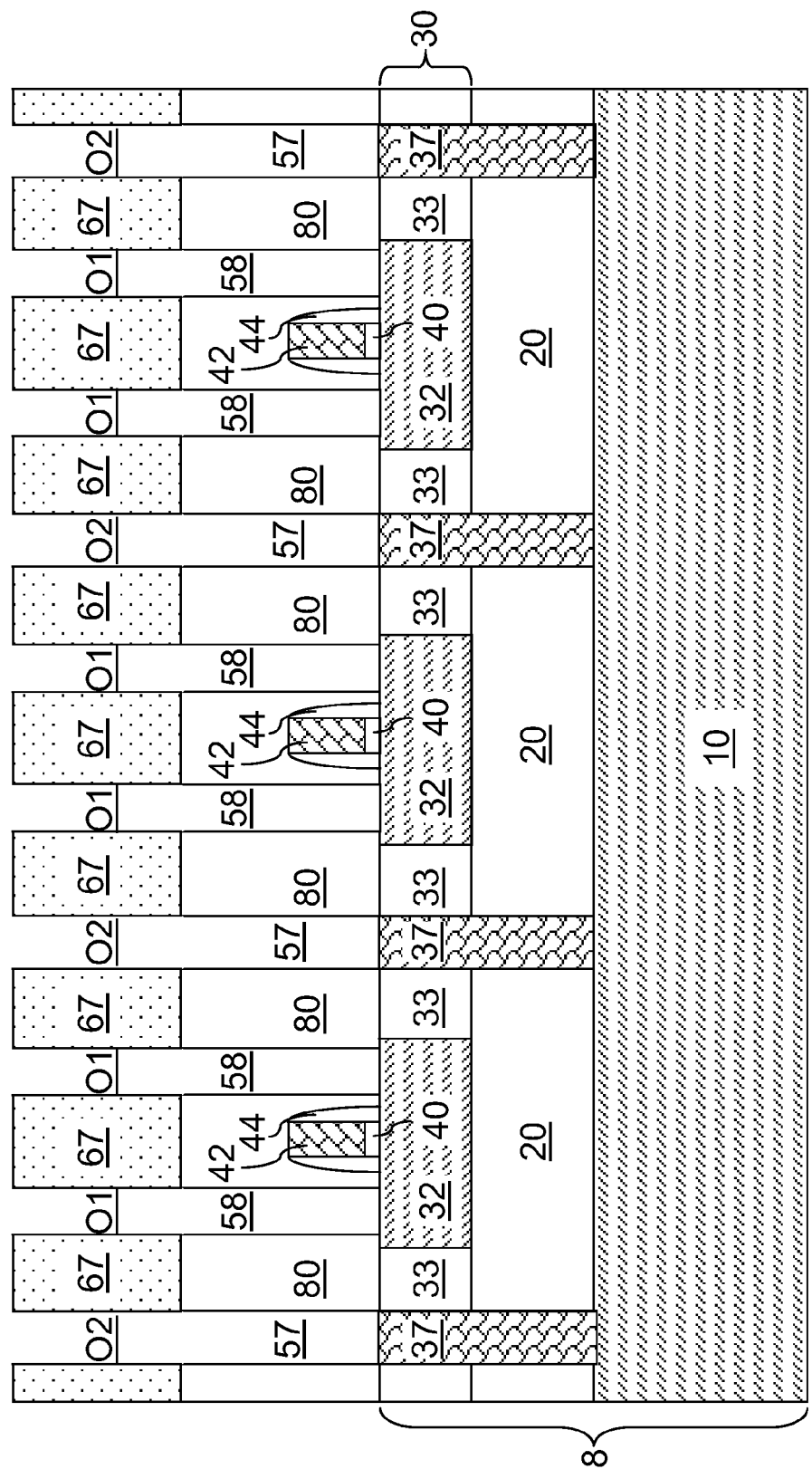

Referring to FIG. 14, at least two field effect transistors are formed on the at least one top semiconductor portion 32 by methods known in the art. Specifically, a gate dielectric 40, a gate electrode 42, and a gate spacer 44 are formed for each field effect transistor. A source region (not shown) and a drain region (not shown) are also formed in the at least one top semiconductor portion 32 for each field effect transistor by implanting dopants employing the gate electrode 42 and the gate spacer 44 of the field effect transistor as a self-aligning implantation mask.

A middle-of-line (MOL) dielectric layer 80 is formed on the at least two field effect transistors, the at least one top semiconductor portion 32, the shallow trench isolation structure 33, and the top surface(s) of the at least one lower conductive via 37. The MOL dielectric layer 80 may comprise the same material and have the same thickness as in the first embodiment.

A photoresist 67 is applied to a top surface of the MOL dielectric layer 80 and lithographically patterned to form openings. The openings include first openings O1 that overlie the at least one top semiconductor portion 32 and at least one second opening O2 that overlies the at least one lower conductive via 37, which is located within the area of the shallow trench isolation structure 33. Each of the first openings O1 is located inside the area of the at least one top semiconductor portion 32 and outside the area of the shallow trench isolation structure 33 in a see-through top-down view. Each of the at least one second opening O2 overlies one of the at least one lower conductive via 37, and is located outside the area of the at least one top semiconductor portion 32 and inside the area of the shallow trench isolation structure 33 in the see-through top-down view.

The pattern of the first openings O1 and the at least one second opening O2 in the photoresist 67 is transferred into the MOL dielectric layer 80 by an anisotropic etch as in the first embodiment. First via cavities 58 are formed underneath the first openings O1 in the photoresist 67, and at least one upper via cavity 57 is formed underneath the at least one second opening O2 in the photoresist 67.

Preferably, the anisotropic etch is selective to the semiconductor material of the at least one top semiconductor portions 32. The anisotropic etch proceeds until a top surface of the at least one top semiconductor portion 32 is exposed at a bottom of the first via cavities 58. At this point, the top surface(s) of the at least one lower conductive via 37 is/are exposed at a bottom of the at least one upper via cavity 57. The anisotropic etch may be selective to the at least one lower conductive via 37. In this case, the depth of the first via cavities 58 and the depth of the at least one upper via cavity 57 may be substantially the same as the thickness of the MOL dielectric layer 80.

A top surface of the at least one top semiconductor portion 32 is exposed at the bottom of each of the first via cavities 58. A top surface of one of the at least one lower conductive via 37 is exposed at the bottom of each of at least one upper via cavity 57. The first via cavities 58 and the at least one lower upper via cavity 57 are formed within the MOL dielectric layer 80, and extend from the top surface of the MOL dielectric layer 80 to a top surface of the top semiconductor layer 30, which coincides with the bottom surface of the MOL dielectric layer 80. The photoresist 67 is subsequently removed.

In a third configuration of the second exemplary semiconductor structure, the at least one upper via cavity 57 is an array of via cavities. Each via cavity in the array of via cavities is a discrete via cavity that does not abut another via cavity. The third configuration may be combined with the first configuration or the second configuration described above since the variations in the features of the third configuration is limited to the at least one upper via cavity 57.

In a fourth configuration of the second exemplary semiconductor structure, the at least one upper via cavity 57 is a single via cavity having a plurality of via cavity portions that are interconnected among one another. In other words, the at least one upper via cavity 57 includes a plurality of via cavity portions that are laterally connected between the top surface of the MOL dielectric layer 80 and a top surface of the top semiconductor layer 30, which coincides with the bottom surface of the MOL dielectric layer 80. The third configuration may be combined with the first configuration or the second configuration described above since the variations in the features of the third configuration is limited to the at least one upper via cavity 57.

Figure 15:
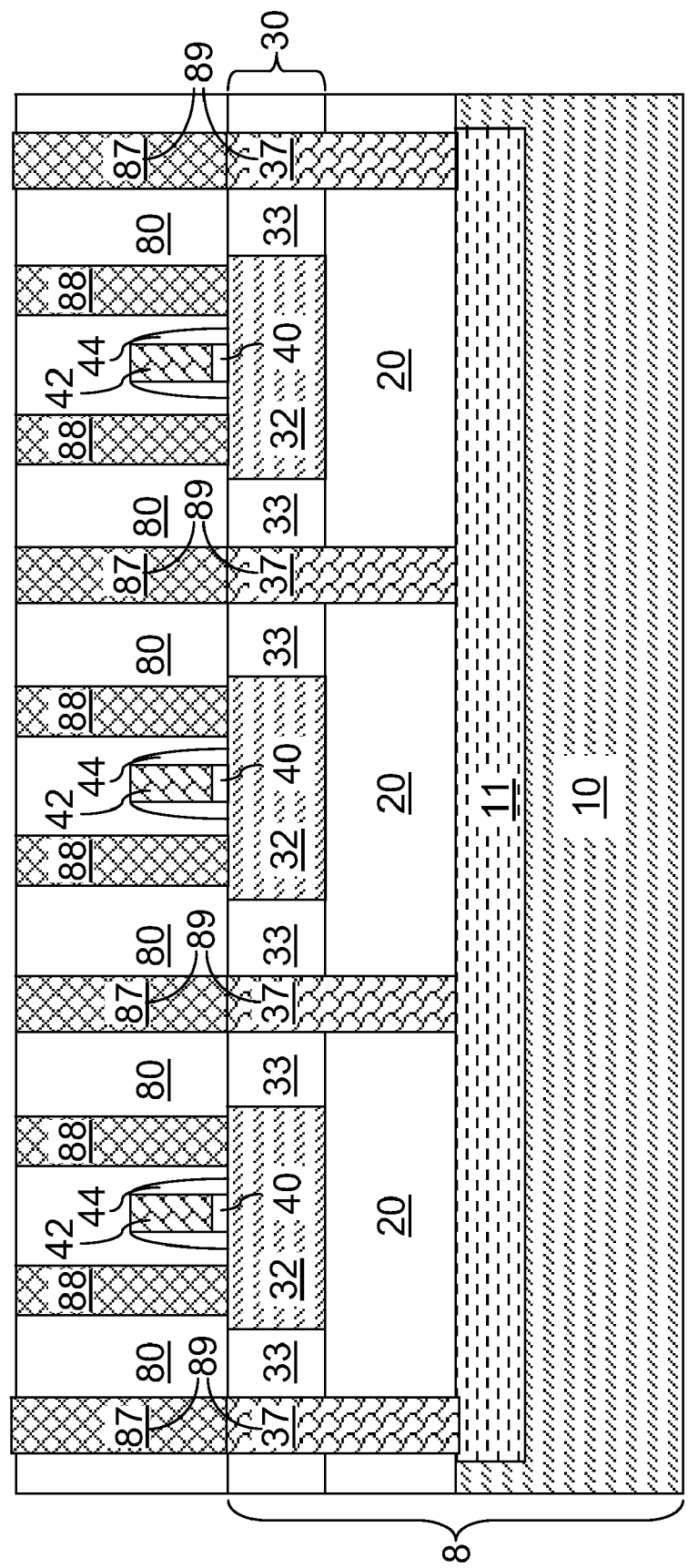
Figure 16:
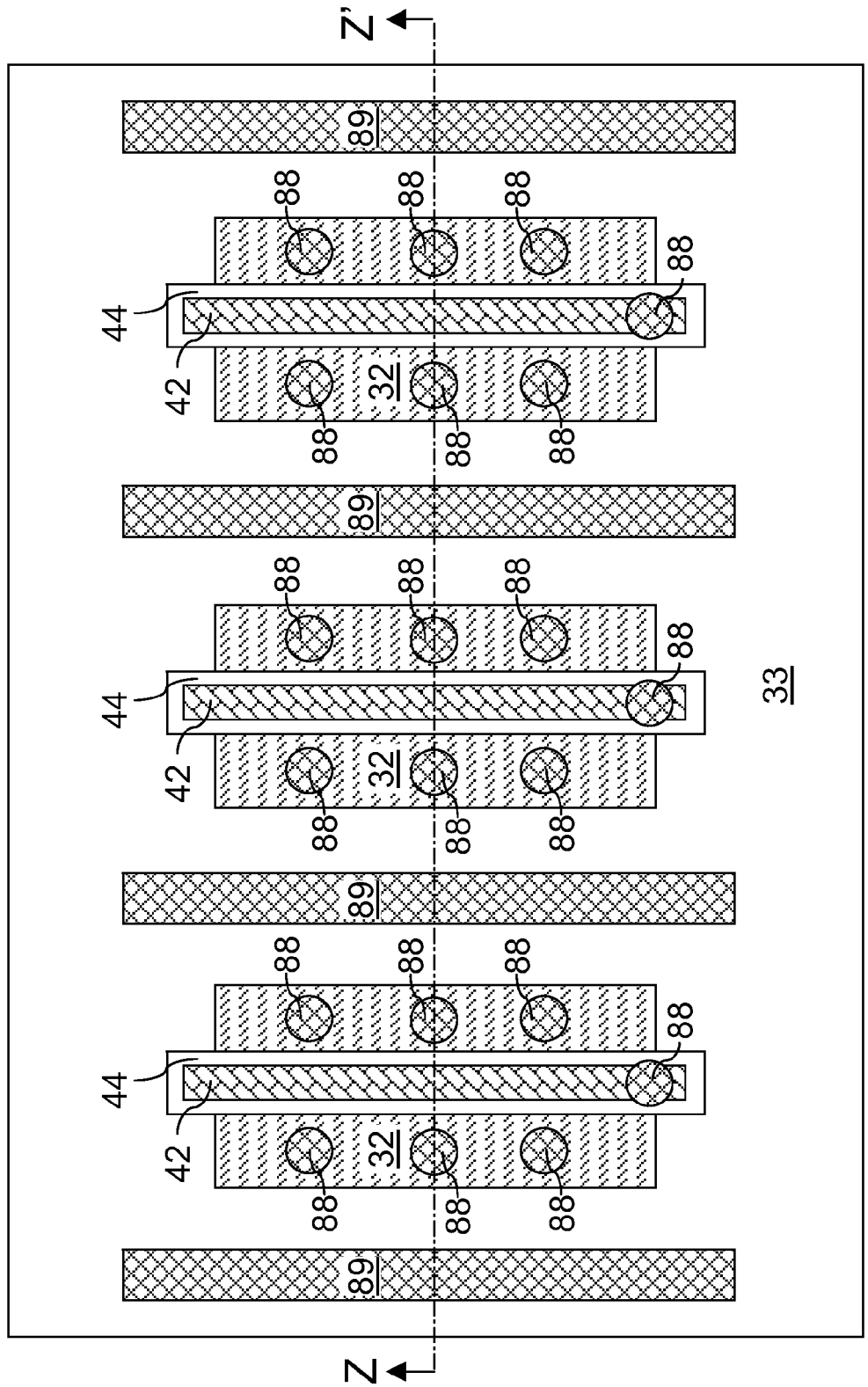
Figure 17:
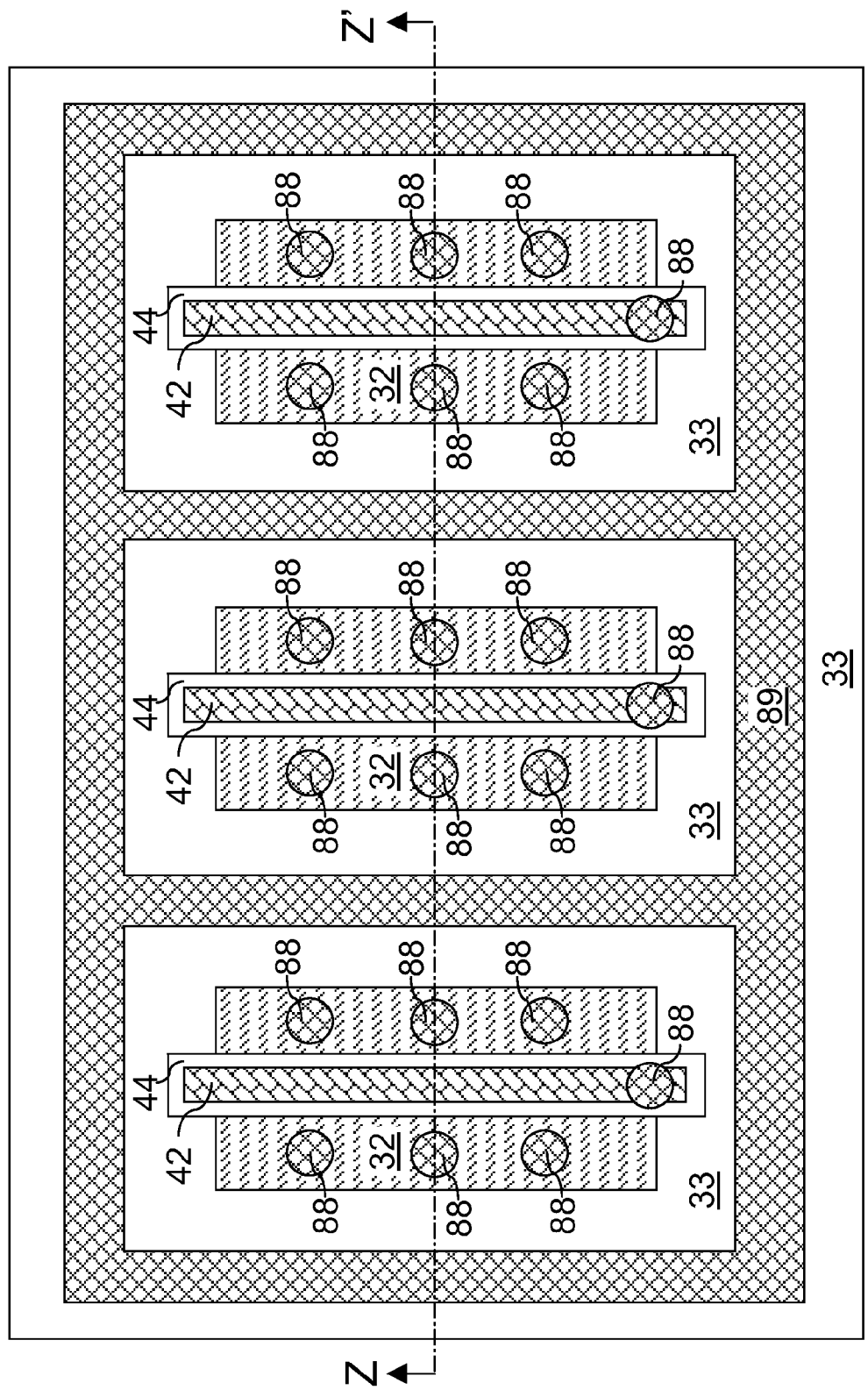

Referring to FIGS. 15, 16, and 17, first conductive vias 88 and at least one upper conductive via 87 are formed in the MOL dielectric layer 80. FIG. 15 is a common vertical cross-sectional view of the third configuration of the second exemplary semiconductor structure shown in FIG. 16 and the fourth configuration of the second exemplary semiconductor structure shown in FIG. 17. FIG. 16 is a modified top-down view of the third configuration of the second exemplary semiconductor structure in which the MOL dielectric layer 80 is omitted for clarity. FIG. 17 is a modified top-down view of the fourth configuration of the second exemplary semiconductor structure in which the MOL dielectric layer 80 is omitted for clarity. The plane Z-Z' in FIGS. 16 and 17 corresponds to the plane of the vertical cross-section for the common vertical cross-sectional view of the second exemplary semiconductor structure shown in FIG. 15.

Specifically, a conductive material is deposited into the first via cavities 58 and the at least one upper via cavity 57. The conductive material may be a doped semiconductor material or a metallic material. For example, the conductive material may be doped polysilicon, a doped silicon-containing semiconductor material, a doped compound semiconductor material, an elemental metal, an alloy of at least two elemental metals, a conductive metal nitride, etc. The excess conductive material above the top surface of the MOL dielectric layer 80 is removed, for example, by chemical mechanical planarization (CMP), recess etch, or a combination thereof. The remaining portions of the conductive material in the first via cavities 58 constitute first conductive vias 88, and the remaining portion(s) of the conductive material in the at least one upper via cavity 57 constitute(s) at least one upper conductive via 87. The first conductive vias 88 may be formed directly on the source regions (not shown separately), the drain regions (not shown separately) and the gate electrodes 42 of the at least two field effect transistors. The source regions and the drain regions are located in the at least one top semiconductor portion 32.

At least one upper conductive via 87 and the at least one lower conductive via 37 collectively constitute at least one second conductive via 89. Each of the at least one second conductive via 89 includes a vertically adjoined stack of at least one of the least one upper conductive via 87 and at least one of the at least one second conductive via 89. Each of the at least one second conductive via 89 extends from a top surface of the MOL dielectric layer 80 through the MOL dielectric layer 80, the shallow trench isolation structure 33, the buried insulator layer 20, and to a top surface of a bottom semiconductor layer 10 of the SOI substrate 8, and is interposed between at least two field effect transistors and separates the at least two field effect transistors.

In the third configuration of the second exemplary semiconductor structure shown in FIGS. 15 and 16, the at least one upper conductive via 87 is an array of conductive vias. Each conductive via in the array of the conductive vias is disjoined from other conductive vias, i.e., does not abut another conductive via.

In the fourth configuration of the second exemplary semiconductor structure shown in FIGS. 15 and 17, the at least one upper conductive via 87 is a single conductive via having a plurality of conductive via portions that are interconnected among one another. In other words, the at least one upper conductive via 87 includes a plurality of conductive via portions that are laterally connected between the top surface of the MOL dielectric layer 80 and the top surface of the shallow trench isolation structure 33.

In the fourth configuration, the at least one upper conductive via 87 is a single contact via of unitary construction, and laterally surrounds the entirety of the at least two field effect transistors. In some cases, all of the plurality of field effect transistors may be laterally enclosed by the single contact via.

Figure 18:
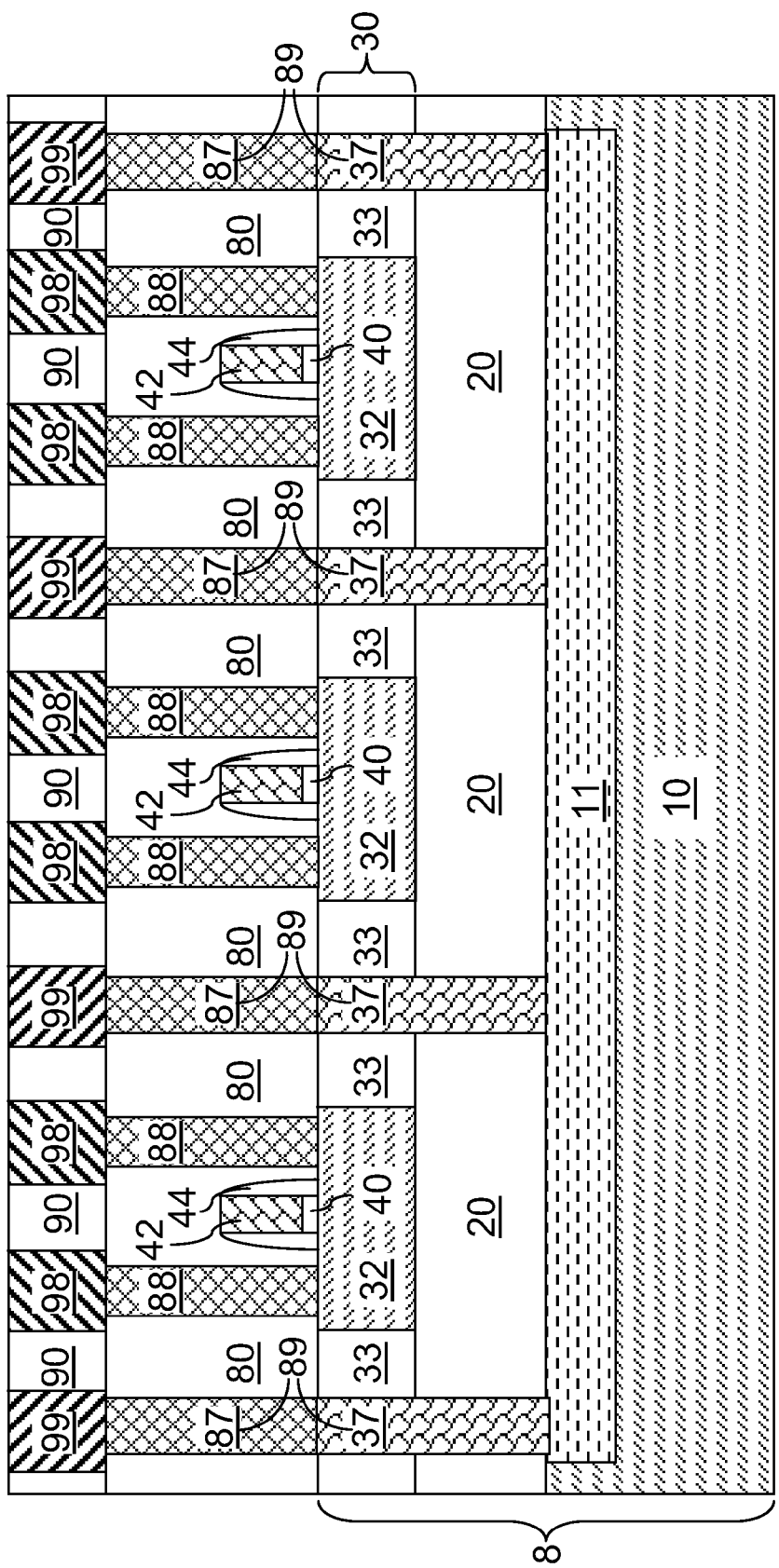

Referring to FIG. 18, an interconnect-level dielectric layer 90, first interconnect-level metal lines 98, and a second interconnect-level metal line 99 are formed in the same manner as in the first embodiment. A top-down view of the third configuration of the second exemplary semiconductor at this point may be substantially the same as FIG. 8 of the first configuration of the first embodiment. A top-down view of the fourth configuration of the second exemplary semiconductor at this point may be substantially the same as FIG. 9 of the second configuration of the first embodiment.

The interconnect-level dielectric layer 90, first interconnect-level metal lines 98, and the second interconnect-level metal line 99 may be formed by the same method as, and may have the same composition and thickness as, in the first embodiment.

Each of the first conductive vias 88 vertically abuts one of the first interconnect-level metal lines 98. Each of the at least one second conductive via 89 vertically abuts the second interconnect-level metal line 99. A constant bias voltage may be applied to bottom semiconductor layer 10 through the at least one second conductive via 89 and the second interconnect-level metal line 99. The magnitude and/or polarity of the constant bias voltage may be determined by a radio frequency signal applied to the at least one of the at least two field effect transistors. For example, the constant voltage may be a voltage that is equal to or less than a first voltage at a maximum positive swing of the RF signal and is equal to or greater than a second voltage at a maximum negative swing of the RF signal. The second interconnect-level metal line 99 may be electrically connected to a constant voltage source or electrical ground by an additional metal interconnect structure (not shown).

In the third configuration of the second exemplary semiconductor structure, the at least one upper conductive via 87 is an array of conductive vias. Each conductive via in the array of the conductive vias vertically abuts the second interconnect-level metal line 99. In some cases, sources and drains of the plurality of field effect transistors may be wired by the first interconnect-level metal lines 98 within the interconnect-level dielectric layer 90, i.e., in a single wiring level.

In the fourth configuration of the second exemplary semiconductor structure, the at least one upper conductive via 87 is a single conductive via having a plurality of conductive via portions that are interconnected among one another. The single contact via is of unitary construction and laterally surrounds the entirety of the at least two field effect transistors. The single conductive via vertically abuts the second interconnect-level metal line 99.

The at least one lower conductive via 37 and the at least one upper conductive via 87 collectively constitute at least one second conductive via 89, which extends from the top surface of the MOL dielectric layer 80 to the bottom surface of the buried insulator layer 20. Thus, at least one second conductive via 89 comprises a vertically abutting stack of the at least one lower conductive via 37 and the at least one upper conductive via 87. The bottom surface of each of the at least one upper conductive via 87 vertically abut a top surface of one of the at least one lower conductive via 37 at a level that is substantially coplanar with the top surface of the top semiconductor layer 30. A physically manifested interface is present at each bottom surface of the at least one lower conductive via 37 that vertically abut one of the at least one lower conductive via 37. The at least one lower conductive via 37 and the at least one upper conductive via 87 may comprise the same conductive material or different conductive materials.

When no radio frequency signal is present in the at least two field effect transistors, the at least one second conductive via 89 directly contacts the bottom semiconductor layer 10. When a radio frequency signal in at least one of the at least two field effect transistors in the top semiconductor layer 30 induces an induced charge layer 11 in the upper portion of the bottom semiconductor layer 10, the at least one second conductive via 89 directly contacts a top surface of the induced charge layer 11.

For configurations for the at least one second conductive via 89 are provided by the present invention, which include: a first combination of the first configuration for the at least one lower conductive via 37 and the third configuration for the at least one upper conductive via 87, a second combination of the first configuration for the at least one lower conductive via 37 and the fourth configuration for the at least one upper conductive via 87, a third combination of the second configuration for the at least one lower conductive via 37 and the third configuration for the at least one upper conductive via 87, and a fourth combination of the second configuration for the at least one lower conductive via 37 and the fourth configuration for the at least one upper conductive via 87.

In the first combination, the at least one lower conductive via 37 comprises an array of lower conductive vias that are disjoined among one another, and the at least one upper conductive via 87 comprises an array of upper conductive vias that are disjoined among one another. The array of lower conductive vias abuts the array of upper conductive vias at multiple separated interface areas that are substantially coplanar with the top surface of the top semiconductor layer 30.

In the second combination, the at least one lower conductive via 37 comprises an array of lower conductive vias that are disjoined among one another, and the at least one upper conductive via 87 comprises a single upper conductive vias of unitary construction. The array of lower conductive vias abuts the single upper conductive via at multiple separated interface areas that are substantially coplanar with the top surface of the top semiconductor layer 30.

In the third combination, the at least one lower conductive via 37 comprises a single lower conductive vias of unitary construction, and the at least one upper conductive via 87 comprises an array of upper conductive vias that are disjoined among one another. The single lower conductive via abuts the array of upper conductive vias at multiple separated interface areas that are substantially coplanar with the top surface of the top semiconductor layer 30.

In the fourth combination, the at least one lower conductive via 37 comprises a single lower conductive vias of unitary construction, and the at least one upper conductive via 87 comprises a single upper conductive vias of unitary construction. The single lower conductive vias abuts the single upper conductive via at a single contiguous interface area that is substantially coplanar with the top surface of the top semiconductor layer 30.

Each combination in the second exemplary semiconductor structure includes the at least two field effect transistors, which may constitute a radio frequency switch for a signal having a frequency from about 3 Hz to about 300 GHz as in the first embodiment.

The radio frequency signal in the at least two field effect transistors causes formation of an induced charge layer 11 in an upper portion of the bottom semiconductor layer 10 in the same manner as in the first embodiment. The electrical charges in the induced charge layer 11 changes polarity at the signal frequency of the radio signal in the at least two field effect transistors. The thickness of the induced charge layer 11 changes in time at the signal frequency in the at least two field effect transistors.

The at least one second conductive via 89 provides a low resistive electrical discharge path for the induced charges in the induced charge layer 11 in the same manner as in the first embodiment, thereby providing a low resistance electrical discharge path for fast discharge of charge carriers in the induced charge layer 11. By reducing the amount of electrical charges in the induced charge layer 11, the present invention reduces secondary capacitive coupling between two disconnected portions of a radio frequency switch when the switch is turned off. Thus, the radio frequency switch provides more effective signal isolation in the off state.

Further, the second, third, and fourth combinations provide an additional advantage of providing an electrical shield that laterally surrounds each of the at least two field effect transistors individually. The single lower conductive via and/or the single upper conductive via laterally surrounds each of the at least two field effect transistors and functions as a signal shield maintained at a constant voltage or an electrically grounding wall that significantly reduces parasitic coupling between adjoining devices among the at least two field effect transistors, thereby enhancing the efficiency of the at least two field effect transistors as a radio frequency switch in an off state.

FIG. 19 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 2-18. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 19 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-18. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-18 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-18. In one embodiment, design structure 990 may comprise a compiled, executable HDL simulation model that functionally simulates the devices shown in FIGS. 2-18.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-18. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming at least two field effect transistors on a top semiconductor layer of a semiconductor-on-insulator (SOI) substrate;
   forming a shallow trench isolation structure in said top semiconductor layer, wherein said shallow trench isolation structure laterally abuts and surrounds said at least two field effect transistors;
   forming a middle-of-line (MOL) dielectric layer over said at least two field effect transistors and said shallow trench isolation structure; and
   forming at least one conductive via extending from a top surface of said MOL dielectric layer through said MOL dielectric layer, said shallow trench isolation structure, a buried insulator layer, and to a top surface of a bottom semiconductor layer of said SOI substrate, wherein said at least one conductive via is interposed between said at least two field effect transistors and separates said at least two field effect transistors, and said at least one conductive via laterally surrounds said at least two field effect transistors and does not contact any semiconductor material in said top semiconductor layer.

2. The method of claim 1, further comprising:
forming at least one via cavity extending from said top surface of said MOL dielectric layer to said top surface of said bottom semiconductor layer; and
filling said at least one via cavity with a conductive material, wherein said at least one conductive via is formed by said conductive material that fills said at least one via cavity.

3. The method of claim 2, wherein each of said at least one conductive via comprises a doped semiconductor material or a metallic material.

4. The method of claim 1, wherein each of said at least one conductive via is of unitary construction and extends from said top surface of said MOL dielectric layer to said top surface of said bottom semiconductor layer.

5. The method of claim 1, further comprising:
forming at least one via cavity extending from a top surface of said shallow trench isolation structure to said top surface of said bottom semiconductor layer; and
filling said at least one via cavity with a conductive material, wherein at least one lower conductive via is formed by said conductive material that fills said at least one via cavity.

6. The method of claim 1, wherein said at least one conductive via is laterally spaced from any semiconductor material in said top semiconductor layer by said shallow trench isolation structure.

7. The method of claim 1, further comprising forming a constant voltage source configured to electrically bias said bottom semiconductor layer of said SOI substrate and said at least one conductive via through a metal interconnect structure at a constant voltage that is different from a voltage of electrical ground.

8. A method of operating a semiconductor device comprising:
providing a semiconductor device including:
at least two field effect transistors located on a top semiconductor layer of a semiconductor-on-insulator (SOI) substrate;
a shallow trench isolation structure laterally abutting said at least two field effect transistors; and
at least one conductive via extending from a top surface of a middle-of-line (MOL) dielectric layer through said MOL dielectric layer, said shallow trench isolation structure, a buried insulator layer, and to a top surface of a bottom semiconductor layer of said SOI substrate, wherein said at least one conductive via is interposed between said at least two field effect transistors and separates said at least two field effect transistors, and said at least one conductive via laterally surrounds said at least two field effect transistors and does not contact any semiconductor material in said top semiconductor layer;
applying a radio frequency (RF) signal to at least one of said at least two field effect transistors, wherein an induced charge layer is formed directly underneath said buried insulator layer; and
electrically biasing said bottom semiconductor layer of said SOI substrate and said at least one conductive via at a constant voltage.

9. The method of claim 8, wherein said induced charge layer changes thickness in time at a signal frequency of said RF signal in said at least one of said at least two field effect transistors.

10. The method of claim 8, wherein charges in said induced charge layer changes polarity in time at a signal frequency of said RF signal in said at least one of said at least two field effect transistors.

11. The method of claim 8, wherein said constant voltage is a voltage that is equal to or less than a first voltage at a maximum positive swing of said RF signal and is equal to or greater than a second voltage at a maximum negative swing of said RF signal.

12. The method of claim 11, wherein said bottom semiconductor layer and said at least one conductive via are electrically grounded.

13. The method of claim 8, wherein said at least one conductive via is laterally spaced from any semiconductor material in said top semiconductor layer by said shallow trench isolation structure.

14. The method of claim 8, wherein said constant voltage is different from a voltage of electrical ground.

15. A method of forming a semiconductor structure comprising:
forming a shallow trench isolation structure laterally surrounding at least one portion of a top semiconductor layer and contacting a top surface of a buried insulator layer in a semiconductor-on-insulator (SOI) substrate;
forming a field effect transistor on each of said at least one portion;
forming a middle-of-line (MOL) dielectric layer over said at least one field effect transistor and said shallow trench isolation structure; and
forming at least one conductive via extending from a top surface of said MOL dielectric layer through said MOL dielectric layer, said shallow trench isolation structure, a buried insulator layer, and to a top surface of a bottom semiconductor layer of said SOI substrate, wherein said at least one conductive via is laterally spaced from any semiconductor material in said top semiconductor layer by said shallow trench isolation structure and said at least one conductive via laterally surrounds said at least one portion of said top semiconductor layer.

16. The method of claim 15, wherein said shallow trench isolation structure laterally surrounds at least two portions of said top semiconductor layer.

17. The method of claim 16, wherein said at least one field effect transistor includes at least two field effect transistors including a first field effect transistor formed on a first portion of said at least two portions of said top semiconductor layer and a second field effect transistor formed on a second portion of said at least two portions of said top semiconductor layer.

18. The method of claim 17, wherein said at least one conductive via laterally surrounds said first portion and said second portion.

19. The method of claim 15, wherein at least a portion of said at least one conductive via extends between a top surface of said top semiconductor layer and said top surface of said bottom semiconductor layer, and contiguously extends at least throughout an entirety of said portion of said at least one conductive via.

20. The method of claim 19, wherein said at least one conductive via is a stack of two conductive vias including an upper conductive via and a lower conductive via that is said portion of said at least one conductive via, a physically manifested interface exists between said upper conductive via and said lower conductive via, and upper conductive via contiguously extends between said top surface of said top semiconductor layer and said top surface of said MOL dielectric layer.

21. The method of claim 15, wherein said at least one conducive via is a single conductive via that contiguously extends between said top surface of said bottom semiconductor layer and said top surface of said MOL dielectric layer.

22. The method of claim 15, further comprising:
forming at least one via cavity extending from said top surface of said MOL dielectric layer to said top surface of said bottom semiconductor layer; and
filling said at least one via cavity with a conductive material, wherein said at least one conductive via is formed by said conductive material that fills said at least one via cavity.

23. The method of claim 22, wherein each of said at least one conductive via comprises a doped semiconductor material or a metallic material.

24. The method of claim 15, further comprising:
forming at least one via cavity extending from a top surface of said shallow trench isolation structure to said top surface of said bottom semiconductor layer; and
filling said at least one via cavity with a conductive material, wherein a lower conductive via is formed by said conductive material that fills said at least one via cavity.

25. The method of claim 15, further comprising forming a constant voltage source configured to electrically bias said bottom semiconductor layer of said SOI substrate and said at least one conductive via at a constant voltage that is different from a voltage of electrical ground.

* * * * *